United States Patent
Lu et al.

(10) Patent No.: US 11,461,519 B2
(45) Date of Patent: Oct. 4, 2022

(54) MACHINE LEARNING TECHNIQUES FOR ESTIMATING MECHANICAL PROPERTIES OF MATERIALS

(71) Applicants: Nanyang Technological University, Singapore (SG); Massachusetts Institute of Technology, Cambridge, MA (US); Brown University, Providence, RI (US)

(72) Inventors: Lu Lu, Providence, RI (US); Ming Dao, West Roxbury, MA (US); Subra Suresh, Singapore (SG); George Karniadakis, Newton, MA (US)

(73) Assignees: Nanyang Technological University, Singapore (SG); Massachusetts Institute of Technology, Cambridge, MA (US); Brown University, Providence, RI (US)

( * ) Notice: Subject to any disclaimer, the term of this patent is extended or adjusted under 35 U.S.C. 154(b) by 0 days.

(21) Appl. No.: 17/620,219

(22) PCT Filed: Mar. 6, 2020

(86) PCT No.: PCT/US2020/021401
§ 371 (c)(1),
(2) Date: Dec. 17, 2021

(87) PCT Pub. No.: WO2020/263358
PCT Pub. Date: Dec. 30, 2020

(65) Prior Publication Data
US 2022/0207218 A1    Jun. 30, 2022

Related U.S. Application Data

(60) Provisional application No. 62/865,670, filed on Jun. 24, 2019.

(51) Int. Cl.
*G06F 30/27* (2020.01)
*B33Y 50/00* (2015.01)
(Continued)

(52) U.S. Cl.
CPC ............ *G06F 30/27* (2020.01); *B29C 64/386* (2017.08); *B33Y 50/00* (2014.12); *G06F 30/17* (2020.01)

(58) Field of Classification Search
CPC ......... G06F 30/27; G06F 30/17; B33Y 50/00; B29C 64/386
(Continued)

(56) References Cited

U.S. PATENT DOCUMENTS

| 4,699,000 A | * | 10/1987 | Lashmore | ................ G01N 3/42 73/794 |
| 5,133,210 A | * | 7/1992 | Lesko | ...................... G01N 3/42 374/46 |

(Continued)

OTHER PUBLICATIONS

Aydin et al. (General Multi-Fidelity Framework for Training Artificial Neural Networks With Computational Models, Frontiers in Materials, 2019, pp. 1-14) (Year: 2019).*
(Continued)

Primary Examiner — Iftekhar A Khan
(74) Attorney, Agent, or Firm — Wolf, Greenfield & Sacks, P.C.

(57) ABSTRACT

Methods and apparatus for extracting one or more mechanical properties for a material based on one or more indentation parameters for the material. The method comprises receiving load-displacement data from one or more instrumented indentation tests on the material, determining, by at least one computer processor, the indentation parameters for the material based, at least in part, on the received load-displacement data, providing as input to a trained neural network, the indentation parameters for the material, deter- (Continued)

mining, based on an output of the trained neural network, the one or more mechanical properties of the material, and displaying an indication of the determined one or more mechanical properties of the material to a user of the computer system.

44 Claims, 16 Drawing Sheets

(51) Int. Cl.
   *B29C 64/386* (2017.01)
   *G06F 30/17* (2020.01)
(58) Field of Classification Search
   USPC .......................................................... 703/2
   See application file for complete search history.

(56) References Cited

U.S. PATENT DOCUMENTS

| | | | | |
|---|---|---|---|---|
| 5,490,416 | A * | 2/1996 | Adler | G01N 3/42 73/82 |
| 6,134,954 | A * | 10/2000 | Suresh | G01N 3/42 702/33 |
| 6,155,104 | A * | 12/2000 | Suresh | G01N 3/42 73/789 |
| 6,311,135 | B1 * | 10/2001 | Suresh | G01N 3/42 702/42 |
| 7,472,603 | B2 * | 1/2009 | Kim | G01N 3/42 73/789 |
| 8,087,282 | B2 * | 1/2012 | Sawa | G01N 3/42 73/1.89 |
| 8,214,162 | B2 * | 7/2012 | Han | G01N 3/42 702/33 |
| 9,297,730 | B2 * | 3/2016 | Sakuma | G01N 3/42 |
| 9,766,170 | B2 * | 9/2017 | Dubois | G01N 3/42 |
| 9,921,128 | B2 * | 3/2018 | Yang | G01N 3/42 |
| 10,139,327 | B2 * | 11/2018 | Puchnin | G01N 3/42 |
| 10,288,540 | B1 * | 5/2019 | Hay | G01N 3/40 |
| 10,451,601 | B2 * | 10/2019 | Han | G01N 3/32 |
| 2003/0060987 | A1 * | 3/2003 | Dao | G01N 3/42 702/42 |
| 2003/0076992 | A1 * | 4/2003 | Banish | G06N 3/02 706/15 |
| 2004/0019469 | A1 * | 1/2004 | Leary | G05B 17/02 703/2 |
| 2004/0220891 | A1 * | 11/2004 | Dodgson | G06N 3/049 706/12 |
| 2016/0377518 | A1 * | 12/2016 | Puchnin | G01B 7/003 73/12.09 |
| 2017/0200063 | A1 * | 7/2017 | Nariyambut Murali | G06K 9/6274 |
| 2017/0206434 | A1 * | 7/2017 | Nariyambut Murali | G06K 9/6256 |
| 2020/0117958 | A1 * | 4/2020 | Brown | G06V 20/10 |
| 2020/0210825 | A1 * | 7/2020 | Szurley | G06N 3/0454 |

OTHER PUBLICATIONS

Zhang et al. (Identification of Plastic Properties From Conical Indentation Using a Bayesian-Type Statistical Approach, Journal of Applied Mechanics, 2019, pp. 1-9) (Year: 2019).*
Mahmoudi et al. (A Neural Networks approach to characterize material properties using the spherical indentation test, Frontiers in Materials, Procedia Engineering 10 (2011) 3062-3067) (Year: 2011).*
Xu et al. (Research of Elastic Anisotropy Based on Neural Network, IEEE. 2008. pp. 528-531) (Year: 2008).*
Invitation to Pay Additional Fees for International Application No. PCT/US2020/021401 dated May 1, 2020.
International Search Report and Written Opinion for International Application No. PCT/US2020/021401 dated Jun. 26, 2020.

* cited by examiner

MACHINE LEARNING TECHNIQUES FOR ESTIMATING MECHANICAL PROPERTIES OF MATERIALS

CROSS-REFERENCE TO RELATED APPLICATIONS

This Application is a national stage filing under 35 U.S.C. 371 of International Patent Application Serial No. PCT/US2020/021401, filed Mar. 6, 2020, entitled "MACHINE LEARNING TECHNIQUES FOR ESTIMATING MECHANICAL PROPERTIES OF MATERIALS", which claims the benefit under 35 U.S.C. § 119(e) of U.S. Provisional Patent Application Ser. No. 62/865,670 filed Jun. 24, 2019, entitled "MACHINE LEARNING TECHNIQUES FOR ESTIMATING MECHANICAL PROPERTIES OF MATERIALS"," the entire contents of each of which is incorporated herein by reference in its entirety.

BACKGROUND

Hardness (H) has long been used to estimate material strength ($\sigma_y$), although the widely used relation H≈3 $\sigma_y$ (where H is the Vickers or Berkovich hardness) is considered only an approximation. Instrumented indentation, where both the penetration depth (h) into the material surface and the corresponding loading force (P) of the indenter tip are continuously documented during loading and/or unloading, has been a topic of experimental and theoretical research throughout the past several decades. Dimensional analysis and scaling functions have been adopted, and explicit universal scaling functions have been established for indentation forward and inverse problems using single and multiple sharp indenter tip geometries for extracting elasto-plastic material properties from instrumented indentation responses. Additionally, efforts have been made to extract elasto-plastic properties from spherical indentation load-displacement curves as well as to quantify the influences of residual stresses.

SUMMARY

Instrumented indentation, where both the penetration depth into the material surface and the corresponding loading force of the indenter tip are continuously documented during loading and/or unloading, has been an important engineering tool for evaluating material properties. Solving the inverse indentation problem (e.g., estimating mechanical properties of the material based on measured load-displacement curves determined from one or more indentation experiments) enables the extraction of elasto-plastic properties from a given set of indentation data. The inverse indentation problem is known for its high sensitivity with small experimental errors in indentation curve characteristics, especially using only a single indenter tip geometry. The high sensitivity in extracting elasto-plastic properties from indentation responses is related to the particular functional nonlinearity of the inverse indentation problem. The inventors have recognized that there is still a great need to significantly improve the accuracy and reduce the sensitivity in solving the indentation inverse problem for obtaining elasto-plastic properties. To this end, some embodiments are directed to using machine learning (ML) techniques, including a multi-fidelity approach, to significantly improve the accuracy and predictability of indentation inverse analyses. As discussed in more detail below, some embodiments relate to the use of one or more of the following ML-based techniques to solve single, dual and multiple indentation inverse problems.

Some embodiments are directed to multi-fidelity ML techniques that achieve one or more of the following:
  significantly reduce the required number of high-fidelity data sets to achieve the same or higher accuracy;
  utilize previously-established equations and/or physical laws to improve the accuracy; and
  integrate simulation data and experimental data for training and significantly reduce material and/or experimental setup related systematic errors.

Some embodiments relate to a computer system configured to train a neural network to extract one or more mechanical properties of a material from indentation parameters for the material. The computer system comprises at least one computer processor, and at least one non-transitory computer readable medium encoded with instructions that, when executed by the at least one computer processor, perform a method. The method comprises providing as input to the neural network, the indentation parameters for the material, training the neural network to map the input indentation parameters to the one or more mechanical properties of the material, and storing the trained neural network on the at least one non-transitory computer readable medium.

In one aspect, the neural network includes a first portion configured to receive as input low-fidelity indentation parameters, a second portion configured to receive as input high-fidelity indentation parameters, and an integration portion that integrates one or more outputs of the first portion and one or more outputs of the second portion.

In another aspect, training the neural network comprises training the first portion of the neural network based on the low-fidelity indentation parameters and training the second portion of the neural network based on the high-fidelity indentation parameters.

In another aspect, training the neural network further comprises integrating both the high-fidelity indentation parameters and the low-fidelity implementation parameters using convolution and/or recursion.

In another aspect, a number of datum in the high-fidelity indentation parameters used to train the first portion of the neural network is less than a number of datum in the low-fidelity indentation parameters used to train the second portion of the neural network.

In another aspect, the high-fidelity indentation parameters include first indentation parameters determined from one or more simulations and second indentation parameters determined from one or more indentation tests on the material.

In another aspect, training the neural network comprises training the neural network to reduce at least one systematic error by using data determined from one or more indentation tests on the material to determine at least some of the high-fidelity indentation parameters.

In another aspect, the low-fidelity indentation parameters include indentation parameters determined using one or more simulations.

In another aspect, the first portion and/or the second portion of the neural network are pre-trained using a baseline training process, and training the neural network to map the input indentation parameters to the one or more mechanical properties of the material comprises training only the second portion of the neural network with high-fidelity indentation parameters.

In another aspect, the neural network includes convolutional and recursive linear and/or nonlinear integration of training data with at least three levels of fidelities.

In another aspect, the indentation parameters include indentation parameters for multiple indenter geometries.

In another aspect, the multiple indenter geometries have different half-included tip angles.

In another aspect, the multiple indenter geometries include multiple indenter shapes.

In another aspect, the one or more mechanical properties include a reduced Young's modulus, a yield strength, and/or a strain hardening parameter.

In another aspect, the one or more mechanical properties include at least two of a reduced Young's modulus, a yield strength, and a strain hardening parameters.

In another aspect, the one or more mechanical properties include a plurality of points on a stress-strain curve.

In another aspect, the one or more mechanical properties include a plurality of strain values at different plastic strains.

In another aspect, the one or more indentation parameters include one or more indentation parameters extracted from a loading portion of an indentation curve, an unloading portion of the indentation curve, and/or both the loading and the unloading portion of the indentation curve.

In another aspect, the one or more indentation parameters include one or more of loading curvature, initial unloading slope, and plastic work ratio.

In another aspect, the one or more indentation parameters include the loading curvature, the initial unloading slope and the plastic work ratio.

In another aspect, the method further comprises receiving load-displacement data for the material, and determining the one or more indentation parameters from the received load-displacement data.

In another aspect, the material comprises a 3D printed material.

In another aspect, training the neural network comprises training the neural network using training data having more than two levels of fidelities.

In another aspect, the neural network includes N portions wherein N is greater than two, each of the N portions being configured to receive as input indentation parameters having a different fidelity, and at least one integration portion configured to integrate one or more outputs of the N portions.

In another aspect, training the neural network comprises training the N portions of the neural network based on indentation parameters having respective fidelities.

Some embodiments relate to a computer system configured to extract one or more mechanical properties for a material based on one or more indentation parameters for the material. The system comprises at least one computer processor, and at least one non-transitory computer readable medium encoded with instructions that, when executed by the at least one computer processor, perform a method. The method comprises receiving load-displacement data from one or more instrumented indentation tests on the material, determining the indentation parameters for the material based, at least in part, on the received load-displacement data, providing as input to a trained neural network, the indentation parameters for the material, determining, based on an output of the trained neural network, the one or more mechanical properties of the material, and displaying an indication of the determined one or more mechanical properties of the material to a user of the computer system.

In one aspect, the trained neural network was trained using high-fidelity indentation parameters and low-fidelity indentation parameters.

In another aspect, the received load-displacement data comprises load-displacement data from instrumented indentation tests having different indenter geometries.

In another aspect, the different indenter geometries have different half-included tip angles.

In another aspect, the different indenter geometries include different indenter shapes.

In another aspect, the one or more mechanical properties include a reduced Young's modulus, a yield strength, and/or a strain hardening parameter.

In another aspect, the one or more mechanical properties include two or more of a reduced Young's modulus, a yield strength, and a strain hardening parameter.

In another aspect, the one or more mechanical properties include a plurality of points on a stress-strain curve.

In another aspect, the one or more mechanical properties include a plurality of strain values at different plastic strains.

In another aspect, the one or more indentation parameters include one or more indentation parameters extracted from a loading portion of an indentation curve, an unloading portion of the indentation curve, and/or both the loading portion and the unloading portion of the indentation curve.

In another aspect, the one or more indentation parameters include one or more of loading curvature, initial unloading slope, and plastic work ratio.

In another aspect, the material comprises a 3D printed material.

In another aspect, the system further comprises an instrumented indentation system configured to perform at least one of the one or more instrumented indentation tests on the material to generate the load-displacement data.

In another aspect, the instrumented indentation system comprises a robotic arm.

In another aspect, the received load-displacement data comprises one or more load-displacement curves, and wherein the indentation parameters comprise values derived from the one or more load-displacement curves.

Some embodiments relate to a method of training a neural network to extract one or more mechanical properties of a material from indentation parameters for the material. The method comprises providing as input to the neural network, the indentation parameters for the material, training, using at least one computer processor, the neural network to map the input indentation parameters to the one or more mechanical properties of the material, and storing the trained neural network on at least one non-transitory computer readable medium.

Some embodiments relate to a method of extracting one or more mechanical properties for a material based on one or more indentation parameters for the material. The method comprises receiving load-displacement data from one or more instrumented indentation tests on the material, determining, by at least one computer processor, the indentation parameters for the material based, at least in part, on the received load-displacement data, providing as input to a trained neural network, the indentation parameters for the material, determining, based on an output of the trained neural network, the one or more mechanical properties of the material, and displaying an indication of the determined one or more mechanical properties of the material to a user of the computer system.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

In recent decades, machine learning has been used very effectively in diverse applications. Deep learning (e.g., the use of deep neural networks (dNNs)) in particular has achieved remarkable success. A number of attempts have been made to use neural networks (NNs) to solve both forward and inverse problems in computational mechanics, and in particular, trained NNs have been developed to extract material properties from instrumented indentation data. Training the NNs is typically performed using a large number of numerical simulation data. For example, based on data points of spherical indentation load-displacement curves from finite element simulations, a trained neural network can be established to estimate the material parameters.

Figure 8:
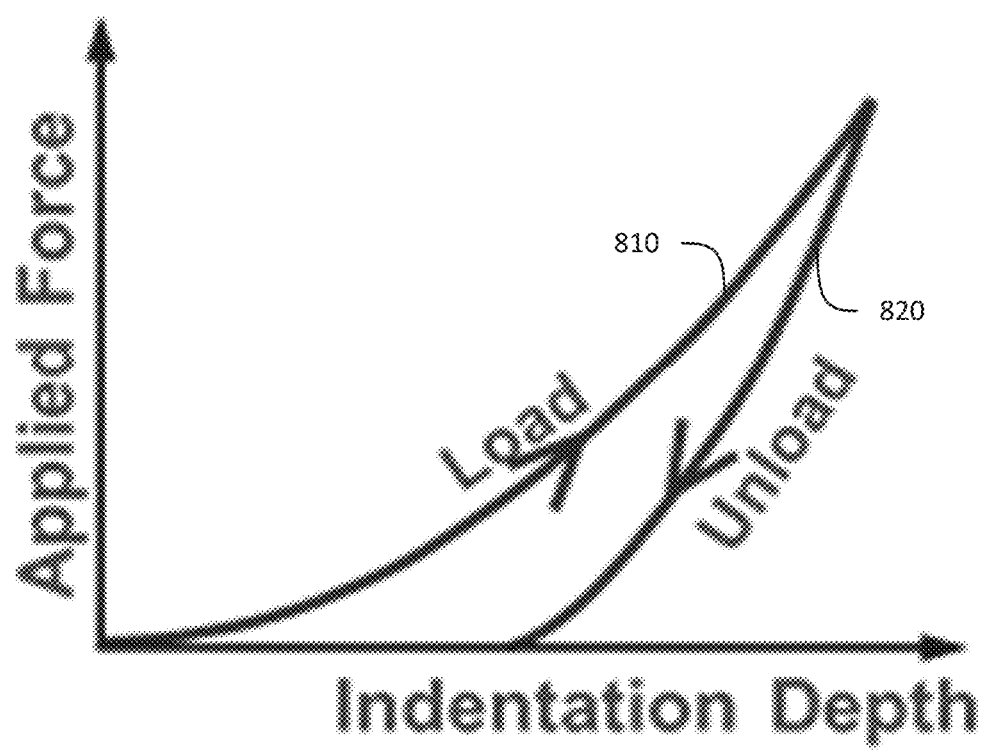
FIG. 8 schematically illustrates a load-displacement curve generated from a loading-unloading test performed by an instrumented indentation system in accordance with some embodiments.

FIG. 8 schematically illustrates an example of a typical load-displacement curve generated from a sharp instrumented indentation experiment. As shown, the load-displacement curve includes a loading part 810 measured as the indenter is pressed into the material, and an unloading part 820 measured as the indenter is withdrawn from the material. Some previous trained NNs were generated to reproduce the loading part of sharp nanoindentation load-displacement curves. In one implementation, a NN-based surrogate model was used in order to reduce the number of FEM conical indentation simulations to extract material properties. Machine learning approaches other than those that use NNs can also be used to solve inverse indentation problems. For example, plastic properties of a material may be identified from conical indentation using a Bayesian-type analysis. The inventors have recognized that previous NN methods used to solve the inverse indentation problem are generally cumbersome to use in practice and involve fitting of the indentation loading (and/or unloading) curves or extensive iterations with finite element simulations. Additionally, such approaches are typically not systematically tested throughout the broad parameter space for characterizing mechanical properties of engineering materials.

In addition to applications of artificial intelligence (AI) and ML algorithms in image/video analysis, natural language processing, etc., ML has also been used for various engineering problems, such as discovery of new materials and in healthcare. ML methods, especially those involve deep learning, typically require large amounts of high-fidelity data for training, which may lead to significantly added costs for acquiring the data, or may be computationally prohibitive to obtain. To reduce the requirements for large amounts of high-fidelity data, some embodiments use multi-fidelity modeling to achieve high accuracy by leveraging both low-fidelity, but relatively low-cost data, and a smaller amount of high-fidelity, but expensive data. Examples of the multi-fidelity modeling techniques used to train a neural network for solving the inverse indentation problem are described in more detail below.

Figure 1A:
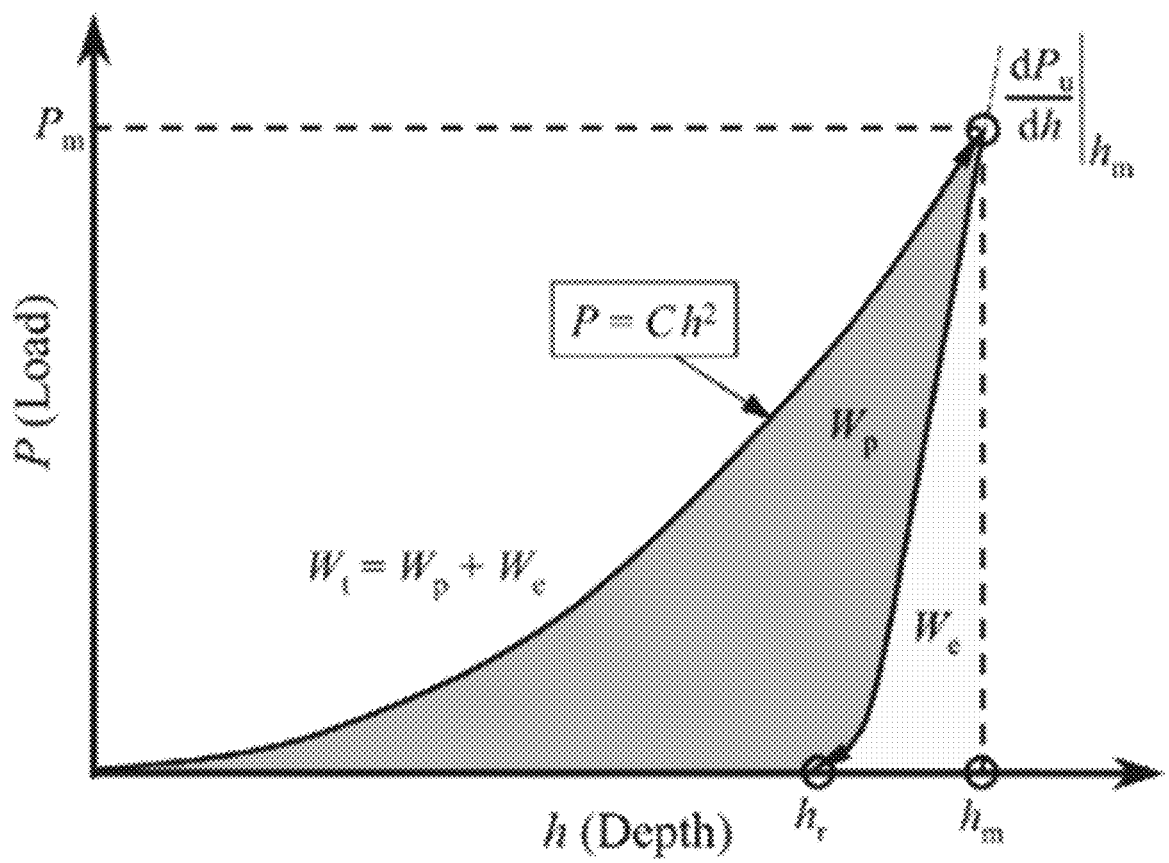
FIG. 1A illustrates a load-displacement response of an elasto-plastic material subject to sharp indentation in accordance with some embodiments.

FIG. 1A schematically shows a typical force-displacement (P–h) response of an elasto-plastic material subject to sharp indentation. The theoretical loading response for a sharp indenter tip is governed by Kick's Law, $$P=Ch^2 \qquad (1),$$

where C is the loading curvature. At the maximum depth $h_m$, the indentation load $P_m$ makes a projected contact area of $A_m$. The average contact pressure is thus defined as $$p_{ave} = \frac{P_m}{A_m},$$

commonly referred as the hardness of the indented material, in accordance with the standard for a commercially available indenter. Upon unloading, the initial unloading slope is defined as $$\left.\frac{dP_u}{dh}\right|_{h_m},$$

where $P_u$ is the unloading force. At the complete unloading, the residual depth is $h_r$. The area under the loading portion is defined as the total work $W_t$; the area under the unloading portion is defined as the recovered elastic work $W_e$; and the area enclosed by the loading and unloading portions is defined as the residual plastic work $W_p = W_t - W_e$.

Figure 1B:
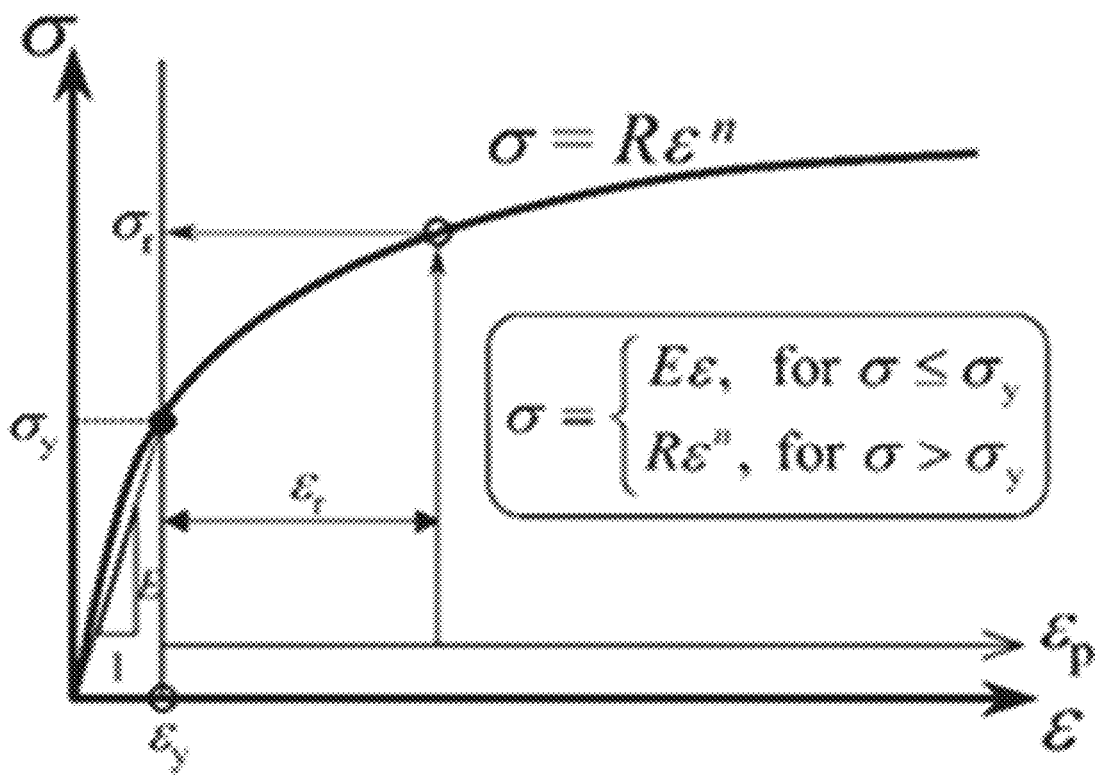
FIG. 1B illustrates a stress-strain response of a power law material in accordance with some embodiments.

FIG. 1B schematically shows a typical stress-strain response of a power law material, which, to a good approximation, can be used for many engineering materials. The elasticity follows Hooke's law, whereas the plasticity follows von Mises yield criterion and power-law hardening. True stress and true strain are related via the following equation.

$$\sigma = \begin{cases} E\varepsilon, & \text{for } \sigma \leq \sigma_y \\ R\varepsilon^n, & \text{for } \sigma \geq \sigma_y \end{cases} \qquad (2)$$

where E is the Young's modulus, R is a strength coefficient, n is a strain hardening exponent, and $\sigma_y$ is the initial yield stress at zero offset strain, also referred to herein as the "yield strength." In the plastic region, true strain can be further decomposed to strain at yield and true plastic strain: $\varepsilon = \varepsilon_y + \varepsilon_p$. For continuity at yielding, the following condition must hold.

$$\sigma_y = E\varepsilon = R\varepsilon_y^n \qquad (3).$$

Thus when $\sigma > \sigma_y$, eqs. (2)-(3) yield $$\sigma = \sigma_y\left(1 + \frac{E}{\sigma_y}\varepsilon_p\right)^n. \qquad (4)$$

In contact mechanics involving an indenter in contact with a substrate material surface, the reduced modulus, E*, is often used to simplify the problem, and is defined as $$E^* = \left[\frac{1-v^2}{E} + \frac{1-v_i^2}{E_i}\right]^{-1}, \qquad (5)$$

where E is Young's modulus of the substrate material, and v is its Poisson's ratio; while $E_i$ is Young's modulus of the indenter, and $v_i$ is its Poisson's ratio.

In general, forward modeling techniques allow for the calculation of a unique indentation response for a given set of elasto-plastic properties, whereas inverse modeling techniques enable the extraction of elasto-plastic properties from a given set of indentation data. A representative plastic strain $\varepsilon_r$ can be defined as a strain level which allows for the construction of a dimensionless description of indentation loading response for a particular sharp indenter tip geometry, independent of strain hardening exponent n. A comprehensive framework using dimensional analysis to extract closed form universal functions was previously developed. Values of representative plastic strain $\varepsilon_r$ were identified versus different indenter geometries among others. It should be noted that $\varepsilon_r$ also depends on how exactly it is defined.

Previously, universal dimensionless functions were constructed for single sharp indentation and dual/multiple indentation with two indenter tip geometries to formulate forward and inverse modeling techniques. In brief, the forward modeling techniques were found to be robust with low sensitivity, whereas the inverse modeling techniques were found to be more sensitive to small experimental errors in extracting elasto-plastic properties. Also it was found that the uniqueness of the solution was not always guaranteed at certain parameter ranges, especially for solving the single indentation inverse problem.

Instead of directly using data points within individual indentation curves for training a NN, as in some previous approaches, some embodiments described herein train a NN by mapping well-established indentation parameters such as loading curvature C, initial unloading slope, $$\left.\frac{dP_u}{dh}\right|_{h_m},$$

plastic work ratio, $W_p/W_t$, etc., provided as input to the NN to elasto-plastic material parameters such as Young's modulus, E (or reduced modulus, E*), yield strength, $\sigma_y$, any or all data points on the stress-strain curve, hardening exponent, n, etc., defined in eqn. (2), or other material parameters characterized by the stress-strain curve, as the output of the NN. Training a NN in this way implicitly utilizes physically-based scaling laws such as Kick's law to simplify the inverse problem and reduce data noise.

In some embodiments, NNs are trained using data generated using finite element conical indentation models and/or data estimated from previous inverse modeling techniques. In the examples described herein, additional finite element simulations were also performed to add more data sets.

Figure 2A:
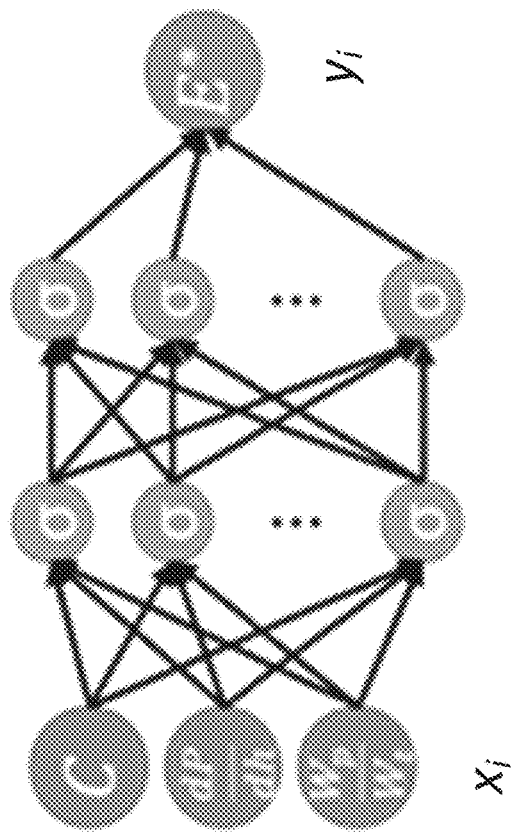
FIG. 2A illustrates a neural network architecture for determining a material property based on single indentation data in accordance with some embodiments.

For solving the single indentation inverse problem, two fully-connected neural networks (NNs) were trained separately to represent the mapping from input parameters $x_i$ (e.g., load-displacement parameters (C, dp/dh, $W_p/W_t$)) to material mechanical properties $y_i$ (e.g., E* and $\sigma_y$), respectively. FIG. 2A illustrates a neural network architecture used in accordance with some embodiments to solve the single indentation inverse problem. In one implementation, the NN architecture had three layers with 32 neurons per layer. The selected nonlinear activation function connecting the nodes between layers was the scaled exponential linear unit (SELU). To avoid over-fitting, $L_2$ regularization with strength 0.01 was used. The loss function minimized during training was the mean absolute percentage error (MAPE). The NNs were optimized using the Adam optimization algorithm with a learning rate 0.0001 for 30000 steps.

Figure 2B:
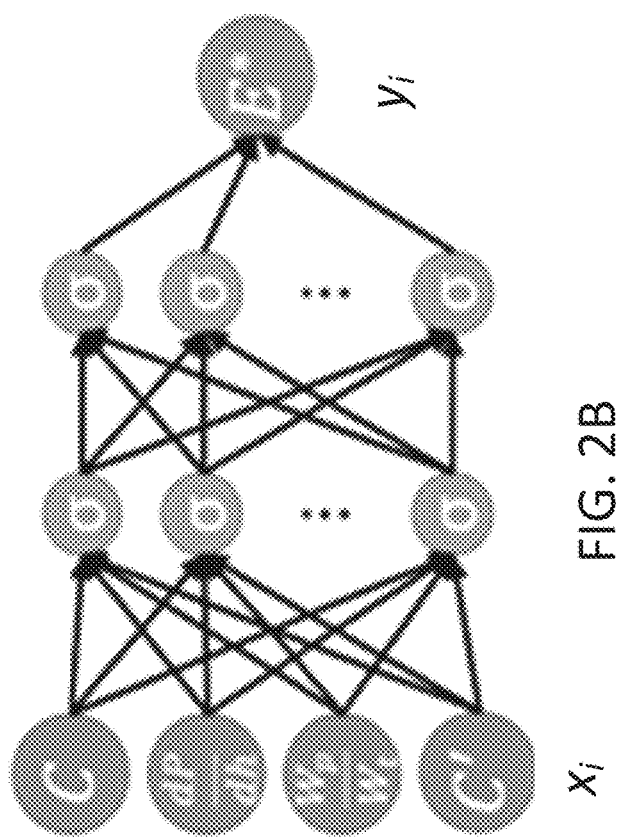
FIG. 2B illustrates a neural network architecture for determining a material property based on multi-indentation data in accordance with some embodiments.

For solving the dual/multiple indentation inverse problem, the NN architecture shown in FIG. 2B was used. In this architecture, the load-displacement parameters (C, dp/dh, $W_p/W_t$) measured using indenter tip(s) with a half-angle of 70.3 degree, and the load-displacement parameters (represented as C') measured using indenter tip(s) with a half angle of 50, 60 and 80 degree were used as the input parameters $x_i$ of neural network, as shown. For the dual/multiple indentation problem, the same neural network architecture as described above for the single indentation problem (e.g., 3 layers, 32 neurons per layer) was used, with the exception of a larger learning rate=0.001. For both the single indentation inverse problem and the dual/multiple indentation inverse problem, only the mechanical property E* is shown as the neural network output $y_i$. However, a similar neural network architecture was also used for obtaining the mechanical property $\sigma_y$ of the material tested. In some embodiments, the NN techniques described in herein may be used to determine any suitable mechanical property of the material including, but not limited to any or all data associated with a stress-strain curve.

Figure 2C:
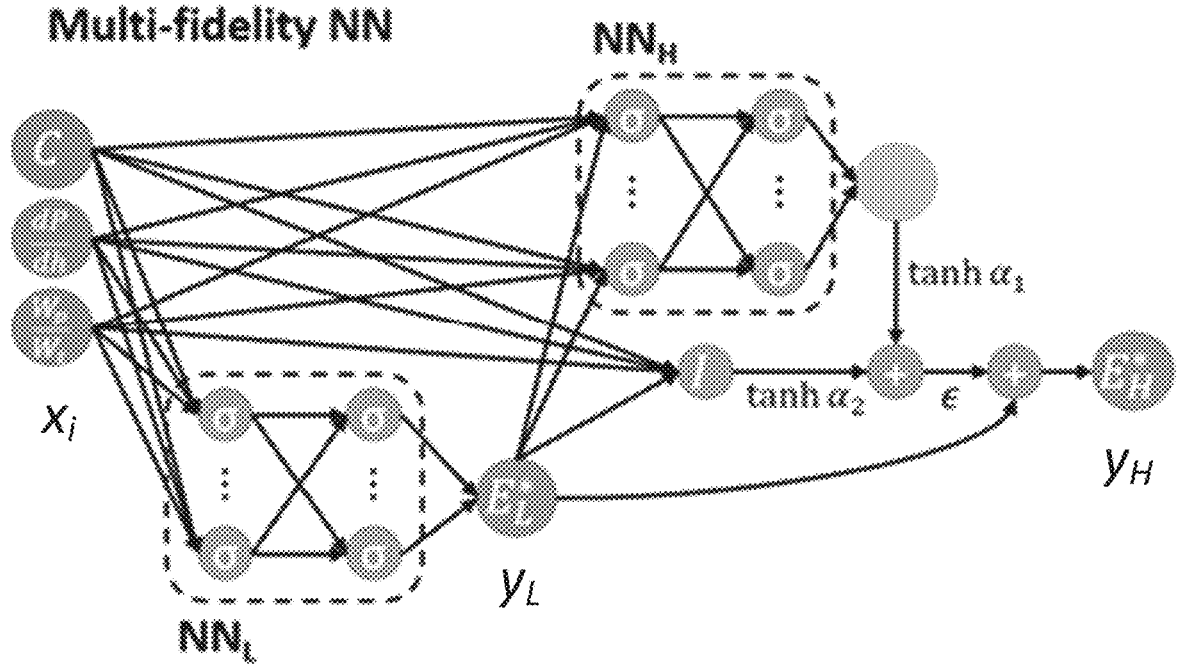
FIG. 2C illustrates a neural network architecture for determining a material property based on multi-fidelity indentation data in accordance with some embodiments.

For solving the multi-fidelity neural network inverse problem, the NN architecture shown in FIG. 2C was used. Low fidelity $y_L$ is the output of a neural network with input x directly, and high fidelity $y_H$ is a function of and $y_L$:

$$y_H(x)=w_1 y_L(x)+w_2 f(x,y_L(x)),$$

where $f(x, y_L(x))$ is a weighted summation of linear function $f_{linear}$ and nonlinear function $f_{nonlinear}$:

$$f(x,y_L(x))=w_3 f_{linear}(x,y_L(x))+w_4 f_{nonlinear}(x,y_L(x)).$$

Figure 2D:
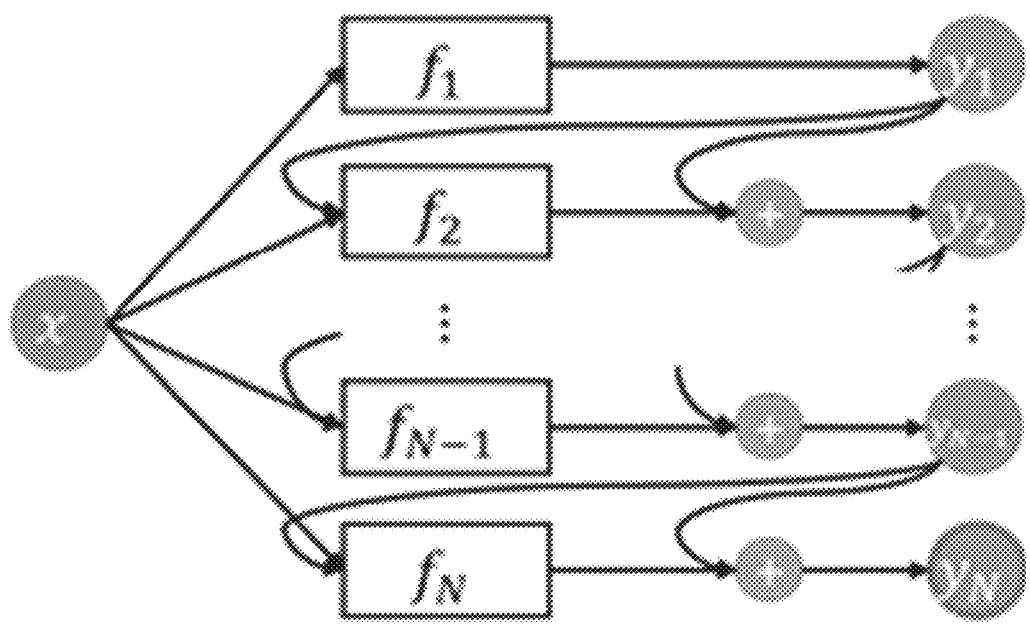
FIG. 2D illustrates a generalized neural network architecture for determining a material property based on multi-fidelity indentation data in accordance with some embodiments.

The following equation was used to correlate the high- and low-fidelity data:

$$y_H=y_L+\epsilon(\tan h\ \alpha_1 \cdot f_{linear}(x,y_L)+\tan h\ \alpha_2 \cdot f_{nonlinear}(x,y_L)), \quad (6)$$

where $f_{linear}(x, y_L)$ and $f_{nonlinear}(x, y_L)$ are linear and nonlinear functions of (x, $y_L$), respectively; $\epsilon=O(1)$ is a preselected small positive number, and $\alpha_1\ \alpha_2$ are parameters to be trained with initial values 0. The term $y_L$ was added explicitly because the residual $y_H$-$y_L$ between two indenters is usually small, and thus it is easier to learn the residual than to learn $y_H$ directly. Because the residual $y_H$-$y_L$ is usually at least one order smaller than $y_H$, $\epsilon=0.1$ was used. Additionally, the multi-fidelity architecture illustrated in FIG. 2C can be used for multiple indentation with different tip geometries as well. Secondly, when there are data sets that have different levels of fidelity (in additional to the simple low and high fidelities), the multi-fidelity architecture can be extended for properly utilizing such complex multi-fidelity data sets; a generalized multi-fidelity architecture is shown in FIG. 2D as an example. Thirdly, all these approaches can be used for extracting plastic properties other than yield strength (e.g., hardening exponent n).

FIG. 2D illustrates a generalized multi-fidelity architecture in accordance with some embodiments. Consider N models of increasing fidelity $y_1, y_2, \ldots, y_N$ with input x. $y_1$ is a function of x directly: $y_1(x)=f_1(x)$, and $y_k$ is constructed recursively for k=2, ..., N: $y_k(x)=w_1 y_{k-1}(x)+w_2 f_k(x, y_{k-1}(x))$, where $f_k(x, y_{k-1}(x))=w_3 f_{k,linear}(x, y_{k-1}(x))+w_4 f_{k,nonlinear}(x, y_{k-1})(x))$. $f_1$ and the nonlinear parts $f_{k,nonlinear}$ can be chosen as neural networks. The same function for $f_k$ and $f_{k+1}$ can be shared in some cases, e.g., when the dataset size of $f_k$ or $f_{k+1}$ is very small, or when the fidelity of $y_k$ and $y_{k+1}$ are similar.

Example Approach #1: Integrating Data Generated from Previously Established Equations (Low Fidelity Data) and Finite Element Simulations Data (High-Fidelity Data) for Improved ML Results.

The multi-fidelity approach was tested using conical single indentation data for materials with n≤0.3, which covers the material parameter space for the majority of engineering metals. The many low-fidelity data sets are generated by using the established formulas described in Dao M, Chollacoop N, Van Vliet K J, Venkatesh T A, Suresh S. *Computational modeling of the forward and reverse problems in instrumented sharp indentation*. Acta Materialia 2001; 49(19):3899-3918 ("Dao 2001"). The high-fidelity data sets were generated from finite element simulations. By using the multi-fidelity approach, a higher accuracy was achieved than using only low-fidelity data sets or using only high-fidelity data sets, as described in more detail below Example Approach #2: Solving the 3D Indentation Problem (e.g., with Berkovich Tip), Integrating 2D Axisymmetric Finite Element Data Sets (Low Fidelity Data) and 3D Finite Element Data Sets (High-Fidelity Data) for Improved ML Results Previous inverse modeling techniques based on conical indentation finite element results were used to obtain approximate solutions of Vickers or Berkovich 3D indentation problems. Some embodiments integrate a large number (e.g., 100) of low-cost 2D axisymmetric finite element data sets (low-fidelity data) and a limited number (e.g., fifteen) higher-cost 3D finite element simulation data sets (high-fidelity data) to solve the Berkovich indentation inverse problem. With the multi-fidelity approach, very good accuracy was achieved with only a small number of high-fidelity data sets, as described in more detail below, and the multi-fidelity approach outperformed the previously established techniques based on only 2D axisymmetric finite element data.

Example Approach #3: Learning and Correcting Material and/or Setup Specific Systematic Errors, Including Some Experimental Data Sets as Part of the High-Fidelity Data Sets for Improved ML Results.

For engineers who have extensive experiences with instrumented-indentation experiments, material-specific (e.g., for a material that is not well-represented by power law hardening) and/or equipment-specific (e.g., nonlinear machine compliance) systematic errors can be exaggerated when performing inverse analyses. Instead of using the inverse analysis results (especially the extracted plastic properties) at their face values, these results obtained by indentation are more often used for ranking material properties. The high sensitivity in solving the indentation inverse problem only makes the situation worse. In some embodiments, this issue is at least partially overcome by adding some experimental data into the high-fidelity data sets used to train the NN for multi-fidelity training Example Approach #2, described above. Specifically, the low-cost 2D axisymmetric finite element data sets were still used as low-fidelity data, and the limited number of 3D Berkovich indentation finite element data sets were used together with part of the experimental data sets as high-fidelity data. This "hybrid" multi-fidelity approach with the high-fidelity data sets including both simulated data and actual experimental data was tested using Berkovich indentation experiments from Al-6061, Al-7075 and a 3D-printed Ti alloy, with significantly improved results, as discussed in more detail below.

Experimental Results

The results of using ML and the NN architectures shown in FIGS. 2A and 2B are first described, followed by the results using different variations of the multi-fidelity approach (e.g., using the architectures shown in FIGS. 2C and 2D). In most cases, the results are compared with high-fidelity finite element simulation data for evaluating the performance of the NN. In addition, verification and performance evaluation were carried out using Berkovich indentation experimental data sets from Al-6061, Al-7075 and a 3D-printed Ti alloy.

Training NNs Using Data Generated from Previously Established Equations

Figure 3:
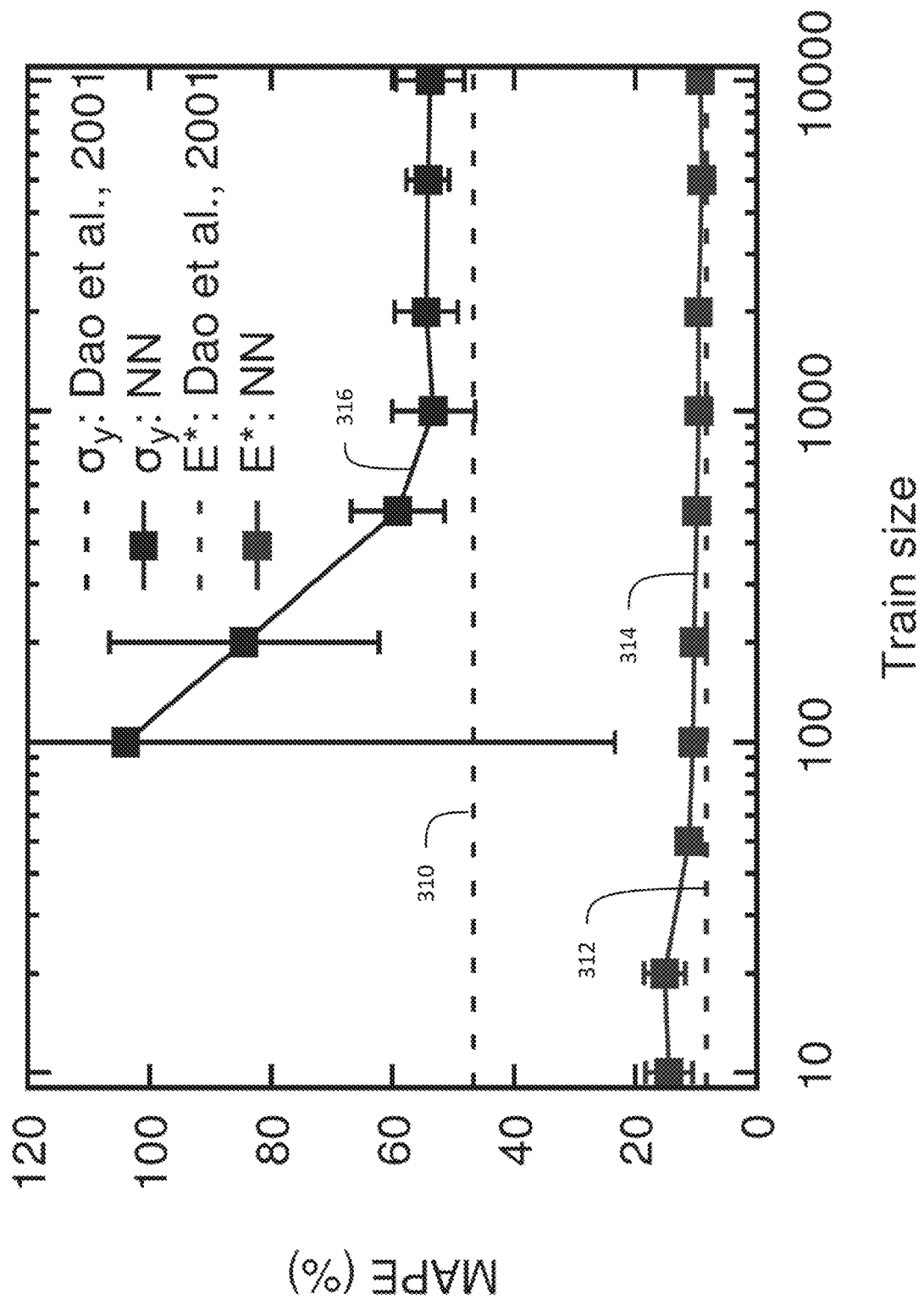
FIG. 3 illustrates a plot showing results of training a neural network having the architecture shown in FIG. 2A on low-fidelity indentation data in accordance with some embodiments.

To demonstrate that NNs are capable of representing the correlations between input parameters $x_i$ (C, dp/dh, $W_p/W_t$) and output elastoplastic parameters (e.g., E* or $\sigma_y$), a data set based on the formulas established in Dao 2001 for conical indentation was generated, and the NNs were trained using these data points, as shown in FIG. 3. The dotted lines 310 and 312 in FIG. 3 show the average error of directly applying the equations in Dao 2001 to estimate mean absolute percentage error (MAPE), and the solid lines 314 and 316 show the errors of the NNs in estimating E* and $\sigma_y$, respectively, versus different training data set size. All data in FIG. 3 assumes a conical indenter with a half-included tip angle of 70.3°. MAPE was calculated using a high-fidelity data set generated by finite element method (FEM) simulations (see Dao 2001 for model setup). The FEM dataset was of size 100, and 3 data points with n>0.3 and $\sigma_y/E^* \geq 0.03$ where the inverse problem may have non-unique solutions were removed. As shown in FIG. 3, errors for extracting $\sigma_y$ (~50% or higher) were much larger than those for extracting E* (~10%), showing the inherent high sensitivity of the inverse problem, especially for plastic properties. As expected, using only data generated from the equations in Dao 2001 for training, the trained NNs did not perform better than the performance of those formulas even with a high number of training data points.

Training NNs Using Data Obtained from High-Fidelity Finite Element Simulations.

Figure 4:
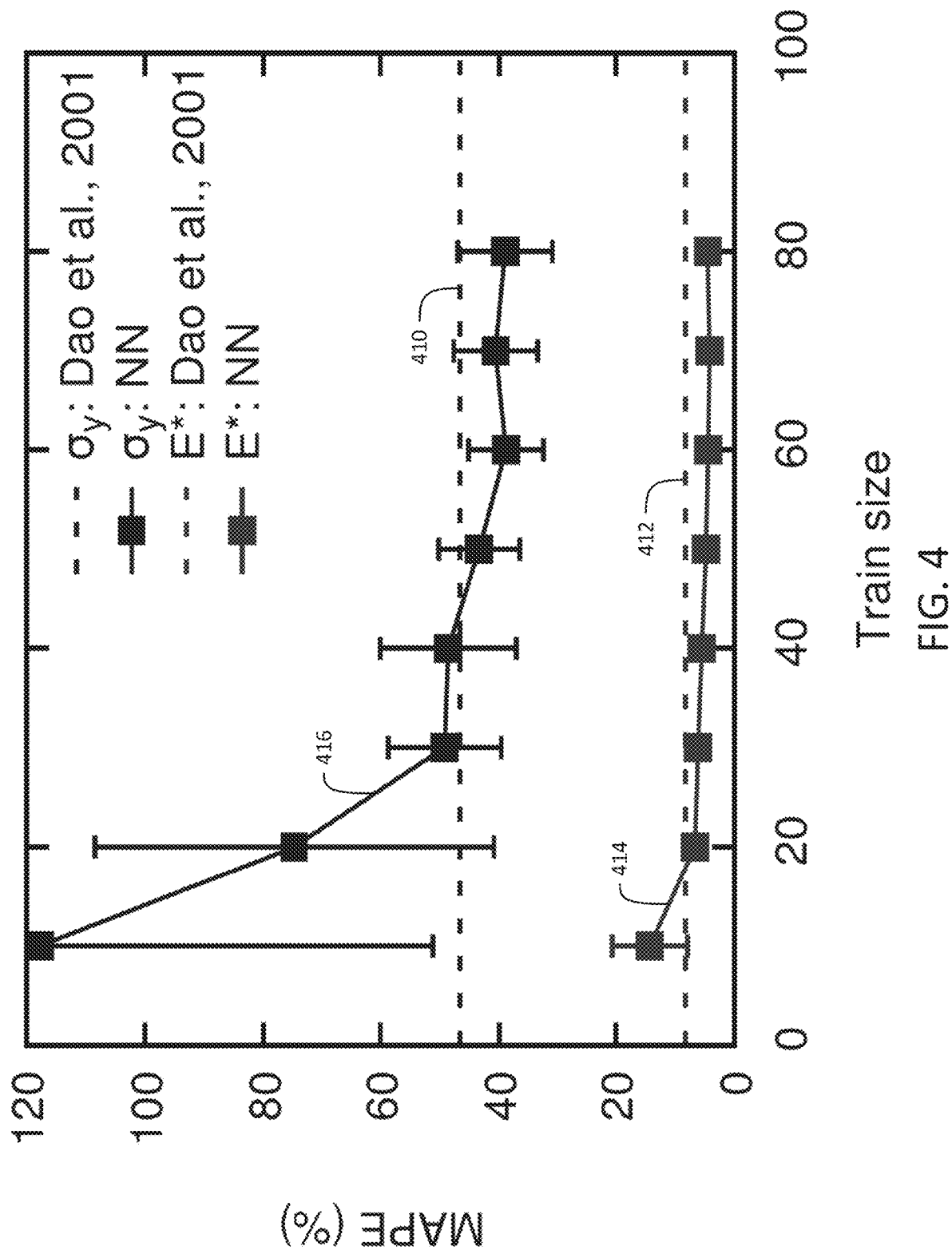
FIG. 4 illustrates a plot showing results of training a neural network having the architecture shown in FIG. 2A on high-fidelity indentation data in accordance with some embodiments.

FIG. 4 shows the results of training NNs to extract the mechanical parameters E* and $\sigma_y$ from load-displacement characteristics using different numbers of conical indentation finite element simulation data points (high-fidelity data). The same conical finite element simulation data mentioned above for FIG. 3 was used. The dotted lines 410 and 412 show the average error of directly applying the previous established equations in Dao 2001, and the solid lines 414 and 416 show the errors of E* and $\sigma_y$, respectively, versus different training data set size. All data in FIG. 4 assume a conical indenter with a half-included tip angle of 70.3°.

As shown, even when only twenty high-fidelity data points were used for training the NN to extract E*, the trained NN performed better than using the previously established technique in Dao 2001. For extracting $\sigma_y$, fifty or more data points were required to achieve better accuracy than the Dao 2001 technique established by direct fitting of the finite element data points. With eighty data points for training the NN, the average error for extracting E* was improved to ~5%, which is significantly lower than ~8% MAPE from using the technique in Dao 2001.

Training NNs Using Finite Element Data Obtained from Multiple Indenter Geometries.

Figure 5A:
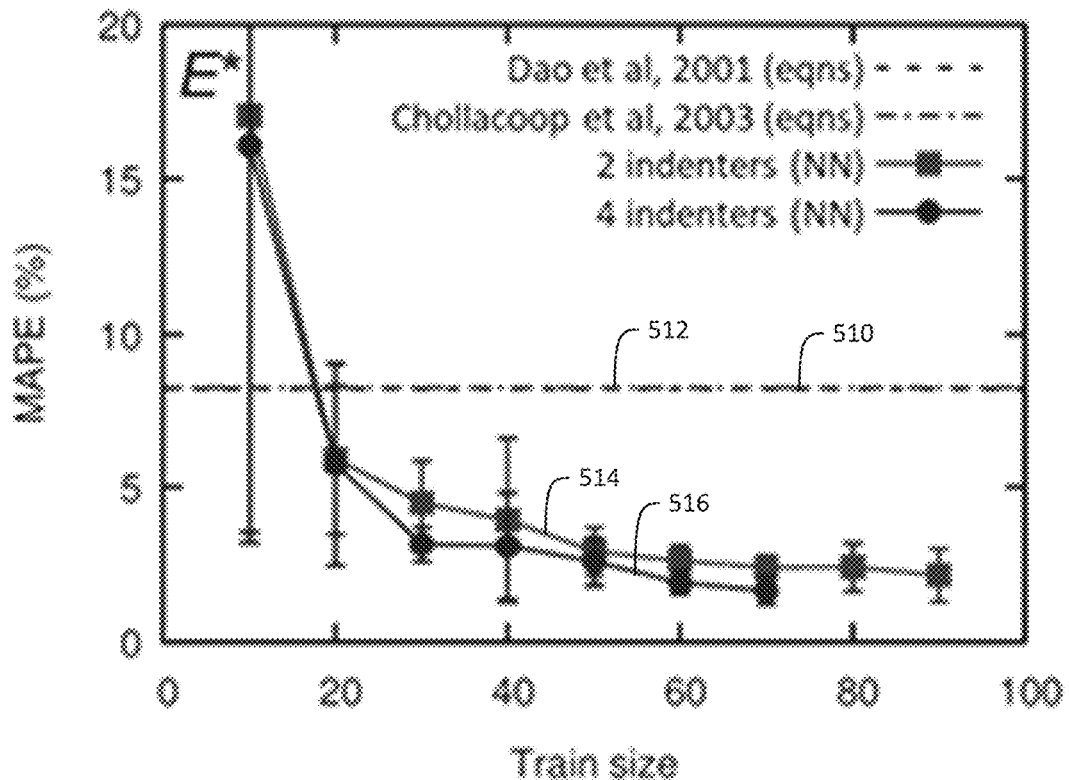
FIGS. 5A and 5B illustrate results of training a neural network having the architecture shown in FIG. 2B on high-fidelity indentation data for the mechanical properties E* and $\sigma_y$, respectively in accordance with some embodiments.
Figure 5B:
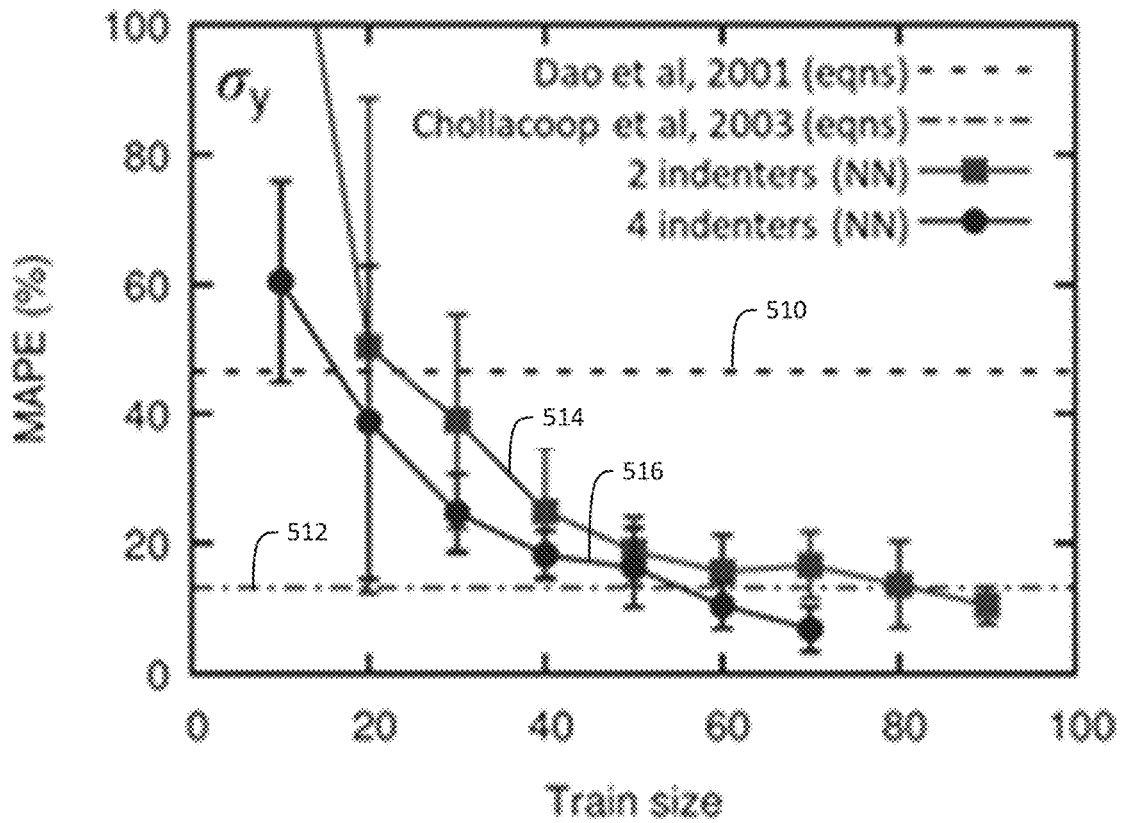

FIGS. 5A and 5B show the results of training NNs for E* and $\sigma_y$, respectively, using finite element (high fidelity) data recorded using 2 or 4 indenters with different tip geometries (e.g., using the NN architecture shown in FIG. 2B). The conical finite element simulations were performed using 100 different elasto-plastic parameter combinations as used above for obtaining single-indentation results. The dotted lines 510 and the dash-dotted lines 512 show the average error of directly applying the previous established single-indentation formulas in Dao 2001 and dual-indentation formulas in Chollacoop N, Dao M, Suresh S. *Depth-sensing instrumented indentation with dual sharp indenters*. Acta Materialia 2003; 51(13):3713-3729 ("Chollacoop 2003"), respectively. The solid lines 514 and solid lines 516 show the errors of 2-indenters and 4-indenters results, respectively, versus different training data set size. The 2-indenters data were obtained using conical tips with 70.3° and 60° half-included tip angles, and the 4-indenters data were obtained using conical tips with 70.3°, 50°, 60° and 80° half-included tip angles.

The trained NNs for 2 indenters (solid lines 514) and 4 indenters (solid lines 516) performed better than the NNs trained on single indenter data, shown in FIG. 4. Accordingly, FIGS. 5A and 5B demonstrate that multiple indenter geometries improve the accuracy of the mechanical property estimation. With large enough training data size ($\geq 20$ for E*, $\geq 60$ for $\sigma_y$ with 2 indenters, and $\geq 90$ for $\sigma_y$ with 4 indenters), the trained NNs began to outperform the dual indentation technique established in Chollacoop 2003. For the trained 2-indenters NNs, the average error for E* achieved an accuracy of ~2%, which is better than the accuracy achieved in both Dao 2001 and Chollacoop 2003 using conventional fitting functions. For the trained 4-indenters NNs, the average error for E* achieved an accuracy of <2%, and for $\sigma_y$ the average error was <7%. Note that with the traditional algorithms, it is not straightforward to utilize "redundant" information for solving unknown variables, while in the case of training the 2-indenters or 4-indenters NNs more input variables can be used.

Improving Inverse Analysis Results Using Multi-Fidelity ML Approaches

Example Approach #1: Integrating Data Generated from Previously Established Equations (Low-Fidelity Data) and Finite Element Simulations Data (High-Fidelity Data) for Improved ML Results.

Figure 6A:
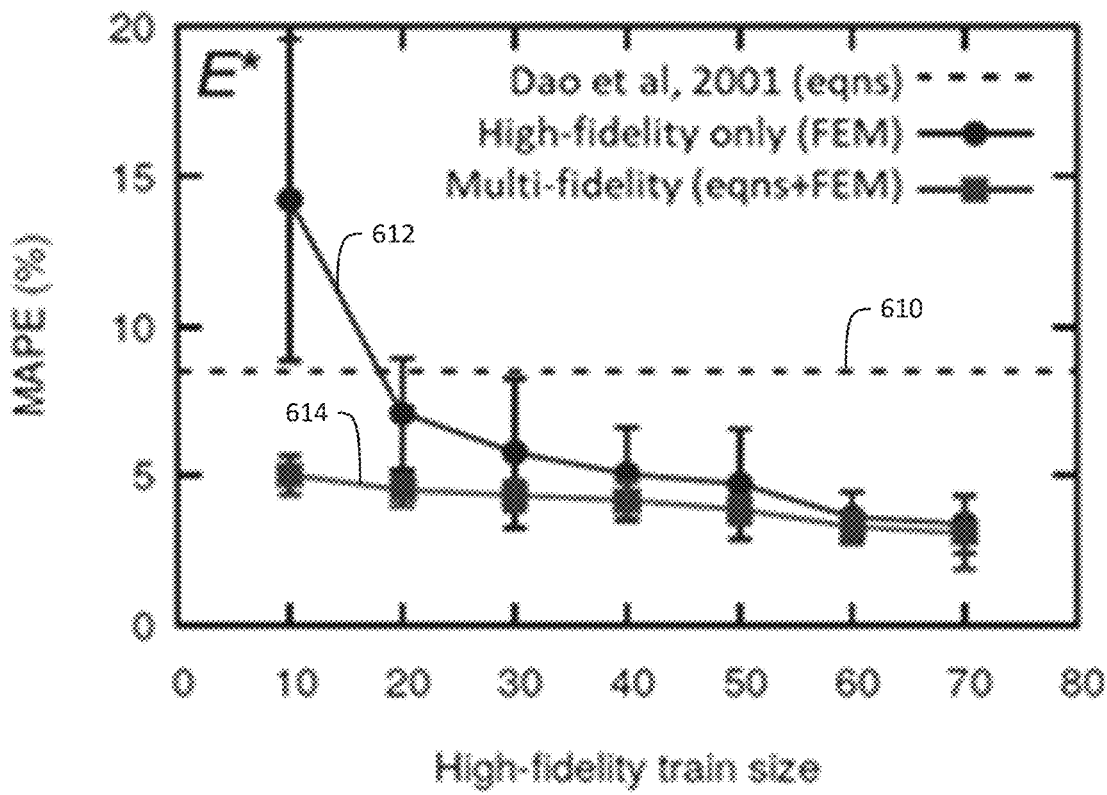
FIGS. 6A and 6B illustrate results of training a neural network having the architecture shown in FIG. 2C on multi-fidelity indentation data for the mechanical properties E* and $\sigma_y$, respectively in accordance with some embodiments.
Figure 6B:
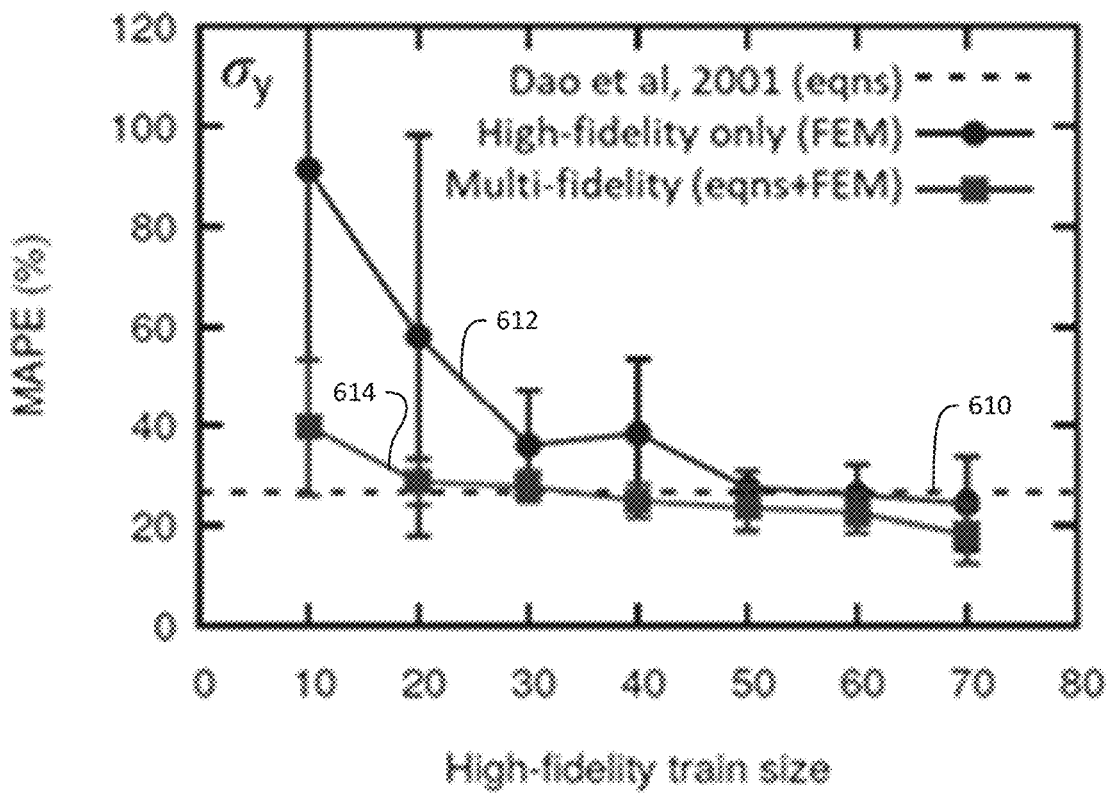

In this example, the multi-fidelity approach described above was tested using the conical single indentation data using only materials with $n \leq 0.3$, which covers the material parameter space for the majority of engineering metals, with the result shown in FIGS. 6A and 6B. The NNs were trained by integrating low-cost low-fidelity data using the previously established equations in Dao 2001 together with a limited number of high-fidelity FEM data for extracting E* (FIG. 6A) and $\sigma_y$ (FIG. 6B). The low-fidelity data used 10,000 data points (for extracting E*) or 100,000 data points (for extracting $\sigma_y$) determined from the formulas in Dao 2001. The high-fidelity data were from the finite element simulations. All data in FIGS. 6A and 6B assumed a conical indenter with a half-included tip angle of 70.3°.

By using the multi-fidelity approach (solid lines 614), (i) a higher accuracy was achieved than using only low-fidelity data (dashed lines 610) or using only high-fidelity data (solid lines 612), and (ii) the required number of high-fidelity data points for achieving a high accuracy was significantly reduced. For example, only ten high-fidelity data points were needed to achieve a 5% average error for extracting E*, and only forty high-fidelity data were needed to achieve better accuracy for extracting $\sigma_y$ compared to the previously-described function-fitting technique described in Dao 2001.

Example Approach #2: For Solving 3D Indentation Problem (e.g., with Berkovich Tip), Integrating 2D Axisymmetric Finite Element Data Sets (Low-Fidelity) and 3D Finite Element Data Sets (High-Fidelity) for Improved ML Results.

Figure 7A:
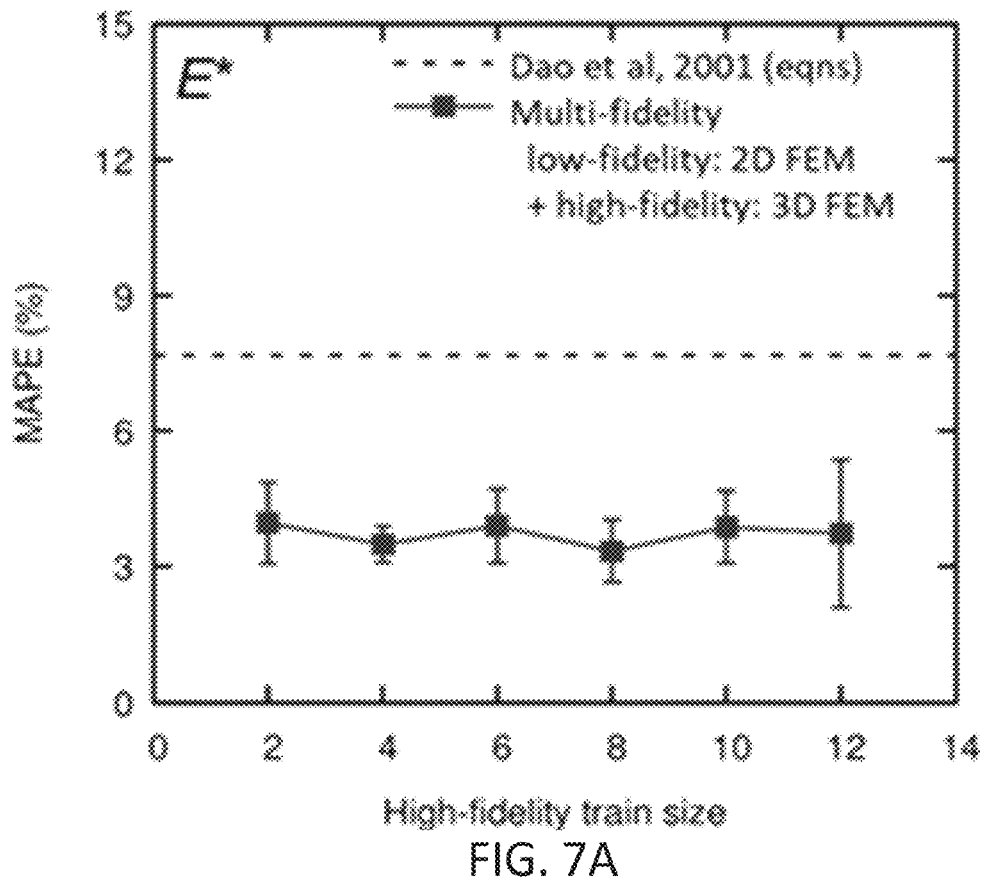
FIGS. 7A and 7B illustrate results of training a neural network having the architecture shown in FIG. 2C on multi-fidelity indentation data for the mechanical properties E* and $\sigma_y$, respectively in accordance with some embodiments.
Figure 7B:
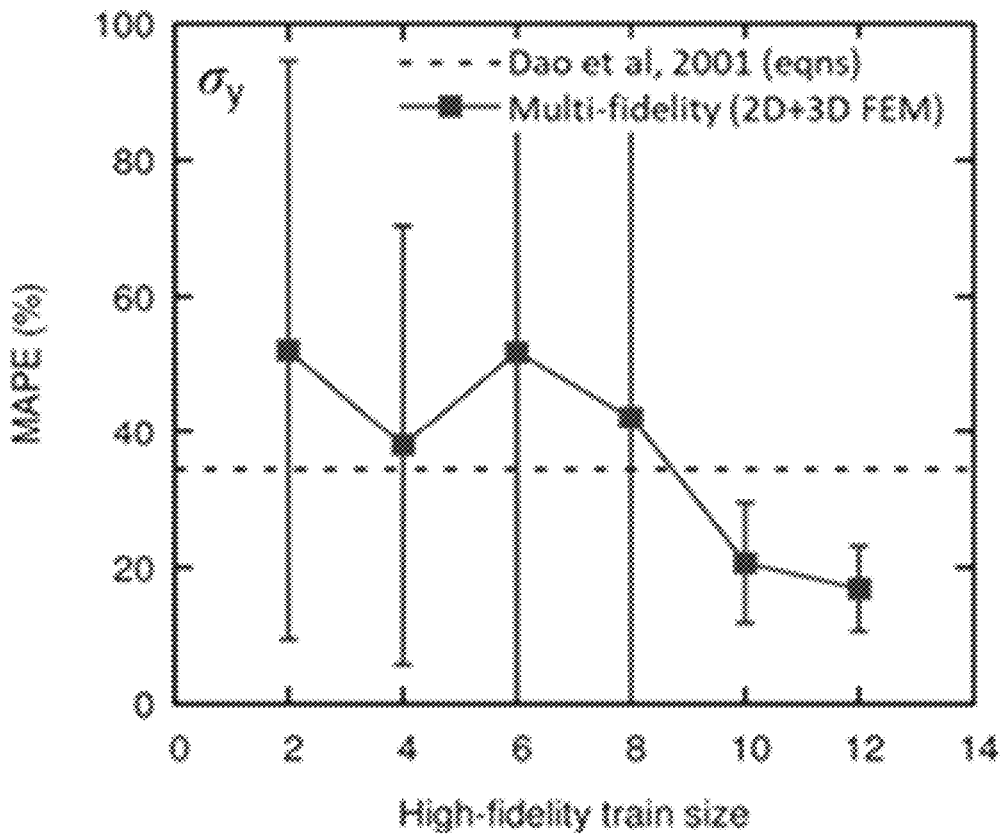

FIGS. 7A and 7B show the results of multi-fidelity NNs trained by integrating 2D axisymmetric FEM simulation results (low-fidelity data) together with 3D FEM simulation data (high-fidelity data) for extracting the mechanical properties E* (FIG. 7A) and $\sigma_y$ (FIG. 7B). The low-fidelity data included 97 axisymmetric FEM simulations with different elasto-plastic parameters. All data in the figure were simulated using a 3D Berkovich indenter.

Although conical indentation finite element results with a 70.3° included half-angle is considered as a good approximation of actual indentation results from a 3D Berkovich or Vickers tip, significant errors can still occur due to the inherent high sensitivity of the inverse problem, especially for extracting plastic properties, as shown in FIGS. 7A and 7B. With the multi-fidelity approach, better results were obtained with a small number of high-fidelity data points, and the multi-fidelity approach outperformed the previously established algorithm based on 2D axisymmetric finite element results.

Example Approach #3: For Learning and Correcting Material and/or Setup Specific Systematic Errors, Including Some Experimental Data Sets as Part of the High-Fidelity Data Sets for Improved ML Results.

In this example, the trained NNs obtained above for Example Approach #2 for a Berkovich indenter tip were tested using two indentation experimental data sets from Aluminum alloys Al6061 (Table 1) and Al7075 (Table 2). The indentation data sets used were the same as those used in Dao 2001, with a slightly different way of accessing $$\left.\frac{dP_u}{dh}\right|_{h_m}$$

per its definition. The results are better than using the previously-established equations in Dao 2001. Both sets of results shown in Tables 1 and 2 seem to have systematic errors, especially for $\sigma_y$.

TABLE 1

Inverse analysis results for Al6061 using trained NNs through a multi-fidelity approach. The tip geometry is Berkovich. The average errors are evaluated as absolute values.

| | NN E* (GPa) | % err E* | $\sigma_y$ (MPa) | % err $\sigma_y$ |
|---|---|---|---|---|
| Test 1 | 70.7 | 0.66% | 340 | 19.73% |
| Test 2 | 72.4 | 3.17% | 362 | 27.34% |
| Test 3 | 70.1 | −0.12% | 338 | 18.93% |
| Test 4 | 68.3 | −2.66% | 298 | 5.09% |
| Test 5 | 69.9 | −0.47% | 309 | 8.69% |
| Test 6 | 67.2 | −0.62% | 295 | 3.74% |
| Ave | 69.8 | 1.90% | 324 | 13.92% |
| Std | 1.83 | | 27 | |
| Std/X | 2.61% | | | 9.46% |

TABLE 2

Inverse analysis results for Al7075 using trained NNs through a multi-fidelity approach. The tip geometry is Berkovich. The average errors are evaluated as absolute values.

| | NN E* (GPa) | % err E* | $\sigma_y$ (MPa) | % err $\sigma_y$ |
|---|---|---|---|---|
| Test 1 | 71.8 | −2.13% | 321 | −35.72% |
| Test 2 | 71.0 | −3.27% | 317 | −36.70% |
| Test 3 | 72.1 | −1.74% | 323 | −35.37% |
| Test 4 | 73.7 | 0.43% | 339 | −32.29% |
| Test 5 | 75.4 | 2.69% | 350 | −30.02% |
| Test 6 | 74.3 | 1.20% | 347 | −30.62% |
| Ave | 73.1 | 1.91% | 333 | 33.45% |
| Std | 1.67 | | 14 | |
| Std/X | 2.27% | | | 2.85% |

In some embodiments, ML was used to learn and reduce the incurred systematic errors observed in the results by randomly picking three experimental data points as added high-fidelity data in the NN training process described above in multi-fidelity Experimental Approach #2. Specifically, the low-cost 2D axisymmetric finite element data sets were still used as low-fidelity data, and the limited number of 3D Berkovich indentation finite element data were used together with three additional experimental data points as the high-fidelity data used to train the multi-fidelity NN.

Using this approach, there were twenty total unique combinations: for all twenty groups of Al6061 results, the combined error of E* was 2.44+/−0.80%, and the combined error of $\sigma_y$ was 3.61+/−3.42%; for all twenty groups of Al7075 results, the combined error of E* was 3.51+/−2.37%, and the combined error of $\sigma_y$ was 3.89+/−2.38%. Tables 3 and 4 show the results for three separate tests using this approach for Al6061 and Al 7075, respectively. It appears that significant improved accuracy can be achieved for $\sigma_y$ with this approach.

TABLE 3

Inverse analysis results for Al6061 using trained NNs through a "hybrid" multi-fidelity approach. The tip geometry is Berkovich. The average errors were evaluated as absolute values.

| | E* (GPa) | % err E* | $\sigma_y$ (MPa) | % err $\sigma_y$ |
|---|---|---|---|---|
| Test 2 | 71.69 | 2.42% | 304 | 7.21% |
| Test 4 | 68.7 | −2.20% | 273 | −3.82% |
| Test 6 | 67.0 | −4.51% | 267 | −5.85% |
| Ave | 69.2 | 3.04% | 282 | 5.62% |
| Std | 2.48 | | 20 | |
| Std/X | 3.53% | | 7.03% | |

TABLE 4

Inverse analysis results for Al7075 using trained NNs through a "hybrid" multi-fidelity approach. The tip geometry is Berkovich. The average errors were evaluated as absolute values.

| | E* (GPa) | % err E* | $\sigma_y$ (MPa) | % err $\sigma_y$ |
|---|---|---|---|---|
| Test 1 | 72.0 | −1.95% | 488 | −2.32% |
| Test 3 | 75.1 | 2.31% | 506 | 1.18% |
| Test 5 | 71.7 | −2.34% | 485 | −3.01% |
| Ave | 72.9 | 2.20% | 493 | 2.17% |
| Std | 1.89 | | 11 | |
| Std/X | 2.58% | | 2.24% | |

The ML methods and NN techniques described herein were also tested on two sets of experiments performed on 3D printed Ti-6Al-4V alloys. For indentations made on Ti-6Al- 4V B3067 surface, Table 5 shows the P–h curve characteristics extracted from the raw indentation data. Table 6 shows the inverse analysis results using indentation P–h curve characteristics in Table 5, using equations in Dao 2001 (Table 6(a)), and trained NNs (Example Approach #2) through a multi-fidelity approach (Table 6(b)). The tip geometry in both cases had a Berkovich geometry. The average errors were evaluated as absolute values. Both methods exhibited an accuracy of ~20% in estimating E*, but high errors in estimating $\sigma_y$, averaging 137% and 96% respectively. The trained NNs results did show smaller standard deviations in estimating both E* and $\sigma_y$, and had better performance in estimating $\sigma_y$.

TABLE 5

Indentation characteristics extracted from a set of raw indentation curves of a 3D printed Ti-6Al-4V alloy (B3067).

| B3067 | C (GPa) | dP/dh (kN/m) | Wp/Wt | $h_m$ (μm) | $P_m$ (N) |
|---|---|---|---|---|---|
| Test 1 | 129.376 | 205.53 | 0.727352 | 0.263752 | 0.009 |
| Test 2 | 144.354 | 201.097 | 0.715369 | 0.249694 | 0.009 |
| Test 3 | 133.248 | 201.712 | 0.737831 | 0.259891 | 0.009 |
| Test 4 | 127.094 | 208.297 | 0.738523 | 0.26611 | 0.009 |
| Test 5 | 129.878 | 210.01 | 0.731975 | 0.263242 | 0.009 |
| Test 6 | 132.799 | 199.346 | 0.736772 | 0.260331 | 0.009 |
| Test 7 | 126.814 | 212.563 | 0.736888 | 0.266403 | 0.009 |
| Test 8 | 137.354 | 211.219 | 0.732194 | 0.255978 | 0.009 |
| Test 9 | 130.028 | 201.245 | 0.735786 | 0.26309 | 0.009 |

TABLE 6

Inverse analysis results using input data from Table 5 for a 3D printed Ti-6Al-4V alloy (B3067), using (a) equations in Dao 2001, and (b) trained NNs through a multi-fidelity approach. The tip geometry is Berkovich. The average errors are evaluated as absolute values.

| B3067 | E* (GPa) | err % | $\sigma_y$(MPa) | err % |
|---|---|---|---|---|
| (a) | | | | |
| Test 1 | 132 | 20.62% | 2487 | 121.81% |
| Test 2 | 133 | 21.30% | 3062 | 173.13% |
| Test 3 | 122 | 11.10% | 2849 | 154.16% |
| Test 4 | 129 | 18.12% | 2449 | 118.50% |
| Test 5 | 135 | 23.50% | 2454 | 118.94% |
| Test 6 | 120 | 9.01% | 2887 | 157.56% |
| Test 7 | 136 | 23.88% | 2344 | 109.08% |
| Test 8 | 137 | 24.81% | 2701 | 140.92% |
| Test 9 | 122 | 11.57% | 2700 | 140.84% |
| Ave | 130 | 18.21% | 2659 | 137.22% |
| Std | 6.3 | | 228 | |
| Std/X | 5% | | 9% | |
| (b) | | | | |
| Test 1 | 129 | 17.72% | 2141 | 90.95% |
| Test 2 | 135 | 23.08% | 2442 | 117.83% |
| Test 3 | 130 | 18.58% | 2251 | 100.84% |
| Test 4 | 129 | 17.86% | 2091 | 86.56% |
| Test 5 | 131 | 19.83% | 2116 | 88.72% |
| Test 6 | 129 | 17.43% | 2264 | 102.00% |
| Test 7 | 131 | 19.22% | 2048 | 82.72% |
| Test 8 | 136 | 24.31% | 2230 | 98.96% |
| Test 9 | 128 | 16.77% | 2203 | 96.48% |
| Ave | 131 | 19.42% | 2198 | 96.12% |
| Std | 2.7 | | 111 | |
| Std/X | 2% | | 5% | |

Table 7 shows the P–h curve characteristics obtained after correcting the raw indentation data with an estimated indenter tip radius of 0.5 μm. Table 8 shows the inverse analysis results using the trained NNs obtained above (multi-fidelity Example Approach #2) for a Berkovich tip with the input data from Table 7. As shown, careful tip radius correction reduced the errors for extracted E* and $\sigma_y$.

TABLE 7

Indentation characteristics extracted from a set of indentation curves of a 3D printed Ti-6Al-4V alloy (B3067), after tip radius correction.

| B3067 | C (GPa) | dP/dh (kN/m) | Wp/Wt | $h_m$ (μm) | $P_m$ (N) |
|---|---|---|---|---|---|
| Test 1 | 95.9243 | 205.53 | 0.727352 | 0.306308 | 0.009 |
| Test 2 | 102.87 | 201.097 | 0.715367 | 0.295786 | 0.009 |
| Test 3 | 96.4741 | 201.712 | 0,737829 | 0.305434 | 0.009 |
| Test 4 | 94.3045 | 208.297 | 0.738523 | 0.308928 | 0.009 |
| Test 5 | 95.6925 | 210.01 | 0.731974 | 0.306679 | 0.009 |
| Test 6 | 98.4949 | 199.346 | 0.736771 | 0.302285 | 0.009 |
| Test 7 | 93.4397 | 212.563 | 0.736889 | 0.310354 | 0.009 |
| Test 8 | 99.3014 | 211.219 | 0.732193 | 0.301055 | 0.009 |
| Test 9 | 96.785 | 201.245 | 0.735786 | 0.304943 | 0.009 |

TABLE 8

Inverse analysis results using input data from Table 7 for a 3D printed Ti-6Al-4V alloy (B3067), using trained NNs through a multi-fidelity approach. The tip geometry is Berkovich. The average errors were evaluated as absolute values.

| B3067 | E* (GPa) | err % | $\sigma_y$ (MPa) | err % |
|---|---|---|---|---|
| Test 1 | 103 | 6.30% | 1516 | 35.20% |
| Test 2 | 106 | 3.76% | 1559 | 39.08% |
| Test 3 | 104 | 5.51% | 1609 | 43.54% |
| Test 4 | 104 | 5.45% | 1503 | 34.09% |
| Test 5 | 104 | 4,93% | 1497 | 33.52% |
| Test 6 | 104 | 4.83% | 1650 | 47.20% |
| Test 7 | 104 | 5.32% | 1429 | 27.48% |
| Test 8 | 107 | 2.23% | 1561 | 39.22% |
| Test 9 | 103 | 5.64% | 1608 | 43.41% |
| Ave | 104 | 4.89% | 1548 | 38.08% |
| Std | 1.3 | | 65 | |
| Std/X | 1% | | 4% | |

It is noted that the results shown in Table 6 appear to have systematic bias for estimating both E* and $\sigma_y$, and the results in Table 8 appear to have systematic bias for estimating $\sigma_y$. In some embodiments, ML is used to learn and reduce the incurred systematic errors by randomly picking three out of nine experimental data points as added high-fidelity data in the NN training process described above in multi-fidelity Example Approach #2. Specifically, the low-cost 2D axisymmetric finite element data sets were used as low-fidelity data input, and the limited number of 3D Berkovich indentation finite element data were used together with three additional experimental data points as high-fidelity data input in the multi-fidelity NN architecture shown in FIG. 2C. There were 84 total unique combinations for randomly selecting the three experimental data points to include in the high-fidelity data input. When the data in Table 5 were taken as input (without tip radius correction), for all 84 groups of 3D printed Ti-6Al-4V B3067 results, the combined error for extracting E* was 6.8+/−1.8%, and the combined error for extracting $\sigma_y$ was 5.9+/−2.8%. Taking the data in Table 7 as input (with radius correction), for all 84 groups of 3D printed Ti-6Al-4V B3067 results, the combined error for extracting E* was 1.4+/−0.4%, and the combined error for extracting $\sigma_y$ was 6.0+/−2.4%. In each case, a significant improvement in extracting both E* and $\sigma_y$ was observed with this "hybrid" multi-fidelity approach. In this case, the "hybrid" multi-fidelity approach learns and corrects the errors from tip radius and other systematic biases.

For indentations made on Ti-6Al-4V B3090 surface, the P–h curve characteristics are shown in Table 9, obtained after correcting the raw data with estimated indenter tip radius of 0.5 μm. Table 10 shows the inverse analysis results using the trained NNs obtained above (Example Approach

2) for a Berkovich indenter tip geometry taking input data from Table 9. The results for $\sigma_y$ appear to have systematic bias. For a different microstructure resulting from a different printing condition (B3090), the same approach with ML was used to learn and reduce the incurred systematic errors by randomly picking three out of nine experimental data points as added high-fidelity data in the NN training process described above in multi-fidelity Example Approach #2. There were 84 total unique combinations: for all 84 groups of 3D printed Ti-6Al-4V B3090 results, the combined error for extracting E* was 2.7+/−0.7%, and the combined error for extracting $\sigma_y$ was 6.8+/−3.0%. Improved accuracy for extracting both E* and $\sigma_y$ was observed with this "hybrid" multi-fidelity approach, demonstrating again the effectiveness of this approach.

TABLE 9

Indentation characteristics extracted from a set of indentation curves of a 3D printed Ti-6Al-4V alloy (B3090), after tip radius correction.

| B3090 | C (GPa) | dP/dh (kN/m) | Wp/Wt | $h_m$ (m) | $P_m$ (N) |
|---|---|---|---|---|---|
| Test 1 | 97.5508 | 189.343 | 0.737209 | 0.303744 | 0.009 |
| Test 2 | 95.2768 | 203.147 | 0.720715 | 0.307347 | 0.009 |
| Test 3 | 91.1717 | 193.866 | 0.739234 | 0.314191 | 0.009 |
| Test 4 | 84.6713 | 205.276 | 0.752419 | 0.326028 | 0.009 |
| Test 5 | 93.3834 | 206.379 | 0.725744 | 0.310447 | 0.009 |
| Test 6 | 100.69 | 187.294 | 0.722895 | 0.298972 | 0.009 |
| Test 7 | 96.3438 | 191.464 | 0.714822 | 0.30564 | 0.009 |
| Test 8 | 97.3653 | 194.4 | 0.726444 | 0.304032 | 0.009 |
| Test 9 | 101.336 | 193.795 | 0.720861 | 0.298017 | 0.009 |

TABLE 10

Inverse analysis results for a 3D printed Ti alloy using trained NNs through a multi-fidelity approach. The tip geometry is Berkovich. The average errors were evaluated as absolute values.

| B3090 | E* (GPa) | err % | $\sigma_y$ (MPa) | err % |
|---|---|---|---|---|
| Test 1 | 102 | 6.87% | 1652 | 41.44% |
| Test 2 | 103 | 6.29% | 1529 | 30.89% |
| Test 3 | 99 | 9.96% | 1498 | 28.26% |
| Test 4 | 98 | 10.89% | 1206 | 3.22% |
| Test 5 | 103 | 6.32% | 1501 | 28.48% |
| Test 6 | 102 | 6.54% | 1688 | 44.56% |
| Test 7 | 99 | 9.29% | 1569 | 34.37% |
| Test 8 | 103 | 6.49% | 1622 | 38.85% |
| Test 9 | 105 | 4.49% | 1664 | 42.44% |
| Ave | 101 | 7.46% | 1548 | 32.50% |
| Std | 2.2 | | 138 | |
| Std/X | 2% | | 9% | |

Another variation of the "hybrid" multi-fidelity approach was also tested. In this test, ML was used to learn and reduce the incurred systematic errors by randomly picking some indentation experimental data points from a different material (while using the same experimental/post-processing setup) as added high-fidelity data in the NN training process described above in multi-fidelity Example Approach #2. Specifically, the low-cost 2D axisymmetric finite element data sets were still used as low-fidelity data, and the limited number of 3D Berkovich indentation finite element data were used together with some additional experimental data points from B3067 (here 3 or 9 are selected from Table 7) as high-fidelity data, while the trained NNs were used to analyze B3090 indentation data shown in Table 9. When all nine B3067 data points shown in Table 7 were used as additional high-fidelity training data, Table 11 shows the typical results from using the trained NNs: the average error of E* was 2.9+/−1.9%, and the average error of $\sigma_y$ was 4.6+/−3.9%. If 3 out of 9 B3067 data points shown in Table 7 were randomly selected as additional high-fidelity training data, there were totally 84 unique combinations for doing so in this case: for all possible combinations, the combined error of E* was 3.3+/−0.6%, and the combined error of $\sigma_y$ was 8.2+/−1.7%. Compared with the results of using 3 out of 9 B3090 data as additional training data, the results were slightly less accurate using 3 out of 9 B3067 data as additional training data. However, comparing with the results of using only 2D+3D FEM data for training, the hybrid multi-fidelity approach using indentation experimental data from a different material (while using the same experimental/post-processing setup) can still perform significantly better.

TABLE 11

Inverse analysis results for a 3D printed Ti alloy (B3090) using trained NNs through a "hybrid" multi-fidelity approach, where experimental data for another 3D printed Ti alloy (B3067) were used as part of the training data. The tip geometry is Berkovich. The errors were evaluated as absolute values.

| B3090 | E* (GPa) | err % | $\sigma_y$ (MPa) | err % |
|---|---|---|---|---|
| Test 1 | 109 | 0.18% | 1652 | 2.21% |
| Test 2 | 105 | 4.45% | 1529 | 5.02% |
| Test 3 | 105 | 4.26% | 1498 | 6.22% |
| Test 4 | 108 | 1.62% | 1206 | 14.48% |
| Test 5 | 105 | 3.93% | 1501 | 6.07% |
| Test 6 | 108 | 1.75% | 1688 | 2.22% |
| Test 7 | 103 | 6.35% | 1569 | 2.64% |
| Test 8 | 107 | 2.68% | 1622 | 1.87% |
| Test 9 | 109 | 0.99% | 1664 | 0.88% |
| Ave | 106 | 2.91% | 1548 | 4.62% |
| Std | 2.0 | | 138 | |
| Std/X | 2% | | 9% | |

Figure 9:
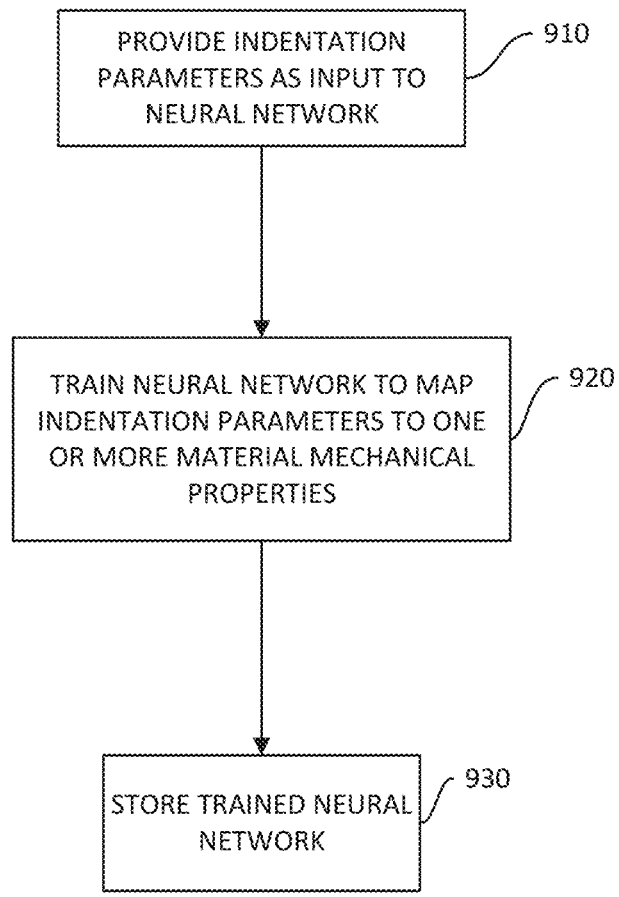
FIG. 9 illustrates a flowchart of a process for training a neural network to map measured indentation parameters to one or more mechanical properties of a material in accordance with some embodiments.

FIG. 9 illustrates a flowchart of a process for training a neural network to determine one or more mechanical properties of a material based on measured indentation parameters in accordance with some embodiments. In act 910, one or more indentation parameters are provided as input to a neural network. Example architectures of neural networks that may be trained in accordance with some embodiments are shown in FIGS. 2A-D, described in more detail above. The process then proceeds to act 920, where the neural network is trained to map the indentation parameters to one or more mechanical properties of the material. As described above, any suitable mechanical properties associated with a stress-strain curve for a material may be used examples of which include, but are not limited to, E* and $\sigma_y$. The process then proceeds to act 930, where the trained neural network is stored for use in determining mechanical properties of a material, for example, using the process illustrated in FIG. 10.

Figure 10:
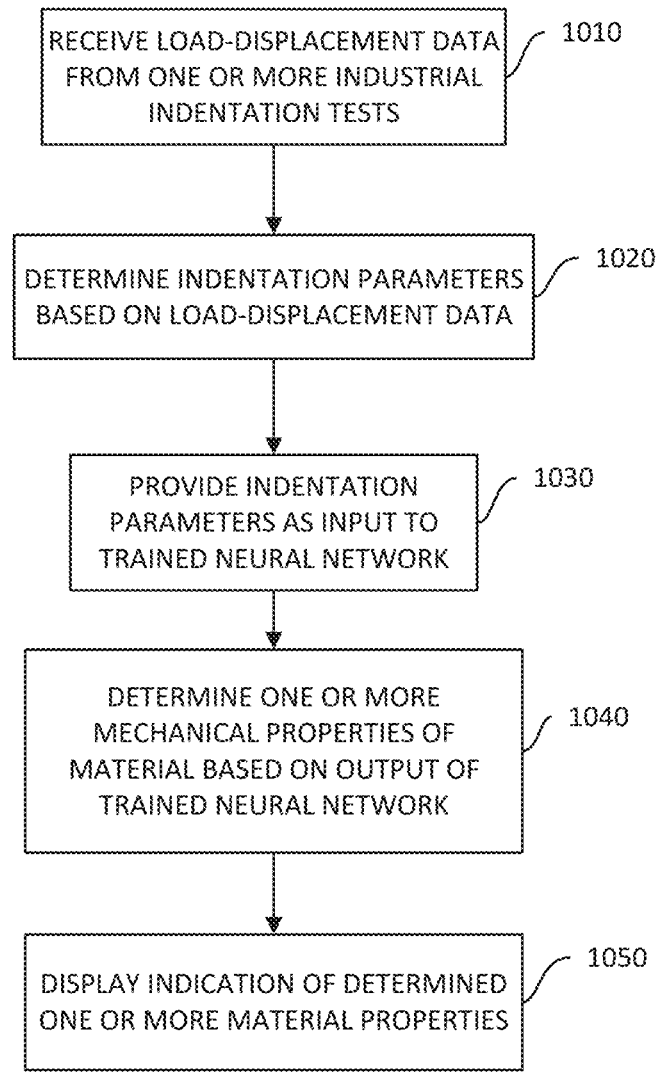
FIG. 10 illustrates a flowchart of a process for using a trained neural network to determine one or more mechanical properties of a material based on measured indentation parameters in accordance with some embodiments.

FIG. 10 illustrates a flowchart of a process for using a trained neural network to determine one or more mechanical properties of a material in accordance with some embodiments. In act 1010 load-displacement data from one or more instrumented indentation tests is received. The load-displacement data may be represented as a loading-unloading curve that includes data from an instrumented indentation test. The process then proceeds to act 1020 where one or more indentation parameters are determined based on the received load-displacement data. The one or more indentation parameters may be determined based on a loading portion of a load-displacement curve, an unloading portion of a load-displacement curve, or both the loading and unloading portions of a load-displacement curve. The determined indentation parameters may include indentation parameters having different levels of fidelity, as described herein. For example, the indentation parameters may include low-fidelity indentation parameters and high-fidelity indentation parameters. In some embodiments, indentation parameters having at least three levels of fidelity are determined.

The process then proceeds to act 1030, where the determined one or more indentation parameters are provided as input to a neural network trained to map indentation parameter(s) to mechanical properties of a material, where the training is performed, for example, using the process described in FIG. 9. The process then proceeds to act 1040, where the one or more material properties of the material are determined based on the output of the trained neural network using one or more of the techniques described herein. The process then proceeds to act 1050, where an indication of the one or more determined material properties are displayed or otherwise presented to a user.

With the different multi-fidelity approaches and the exercises using different multi-fidelity data sets discussed above, the fidelity levels can roughly be ranked from low to high. For example, taking the most accurate correlation between Berkovich indentation data of B3090 alloy and the uniaxial stress-strain behavior (including both elastic and plastic parts) as the highest fidelity function (ultimate goal), then from the increasing accuracies from utilizing different combinations of these data sets, the fidelity levels can be roughly ranked from low to high: data generated directly from using equations in Dao 2001, 2D axisymmetric FEM conical indentation data, 3D FEM Berkovich indentation data, 3D-printed B3067 Ti alloy Berkovich indentation data (with the same experimental and post-processing setup), and 3D-printed B3090 Ti alloy Berkovich indentation data (with the same experimental and post-processing setup). When there are complex multi-fidelity data sets in engineering problems, the generalized architecture shown in FIG. 2D can be utilized.

In some embodiments, the ML and NN techniques described herein may be used to predict any or all points on a stress-strain curve of a material to, for example, more fully characterize the elasto-plastic properties of the material. For instance, data points on the stress-strain curve beyond the yield strength $\sigma_y$ may be predicted to more fully characterize the plastic behavior of the material.

Figure 11A:
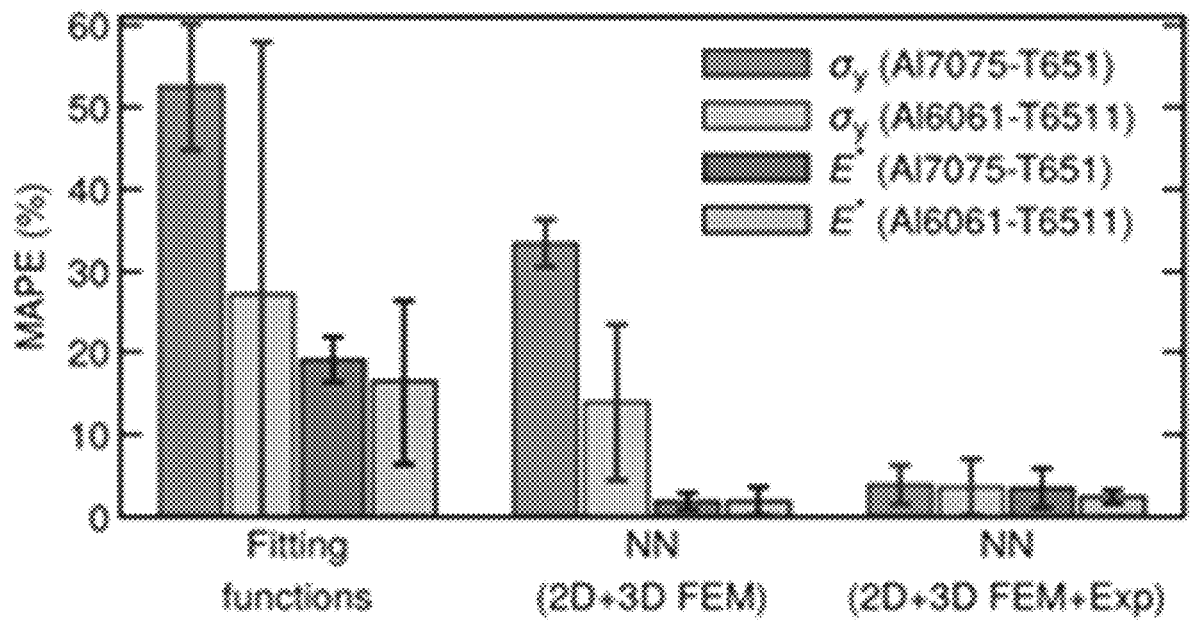
FIGS. 11A and 11B illustrate inverse analysis results of mean average percentage error (MAPE) for predicting different material properties (including yield strength and any selected points on the stress-strain curve) for two different aluminum alloys in accordance with some embodiments.

FIG. 11A summarizes inverse analysis results for two different aluminum alloys using different approaches. The results labeled "fitting functions" were obtained directly using previously established equations in Dao 2001. The results labeled as "NN (2D+3D FEM)" were obtained using NNs trained by integrating 2D axisymmetric FEM data (low fidelity) with 3D Berkovich FEM data (high fidelity). The results labeled "NN (2D+3D FEM+EXP)" were obtained using neural networks trained by adding experimental results as high-fidelity training data in addition to the 2D and 3D FEM training data.

As shown, the neural networks trained by 2D axisymmetric FEM results (low fidelity) together with 3D FEM simulation data (high fidelity) perform better than the previous established equations in Dao 2001. The NNs trained by adding experimental results as high-fidelity training data to the 2D and 3D FEM data perform very well for both E* and $\sigma_y$, with MAPE less than 4% for both alloys Al6061-T6511 and Al7075-T651, leading to significantly improved accuracy for $\sigma_y$ with this "hybrid" multi-fidelity approach.

Assuming, for example, power-law strain-hardening behavior, some embodiments can also be used to extract strain-hardening characteristics from instrumented indentation. To achieve that, NNs are first trained to predict stresses at different plastic strains, and then the strain-hardening exponent is computed by least-squares fitting of the power-law hardening function.

Figure 11B:
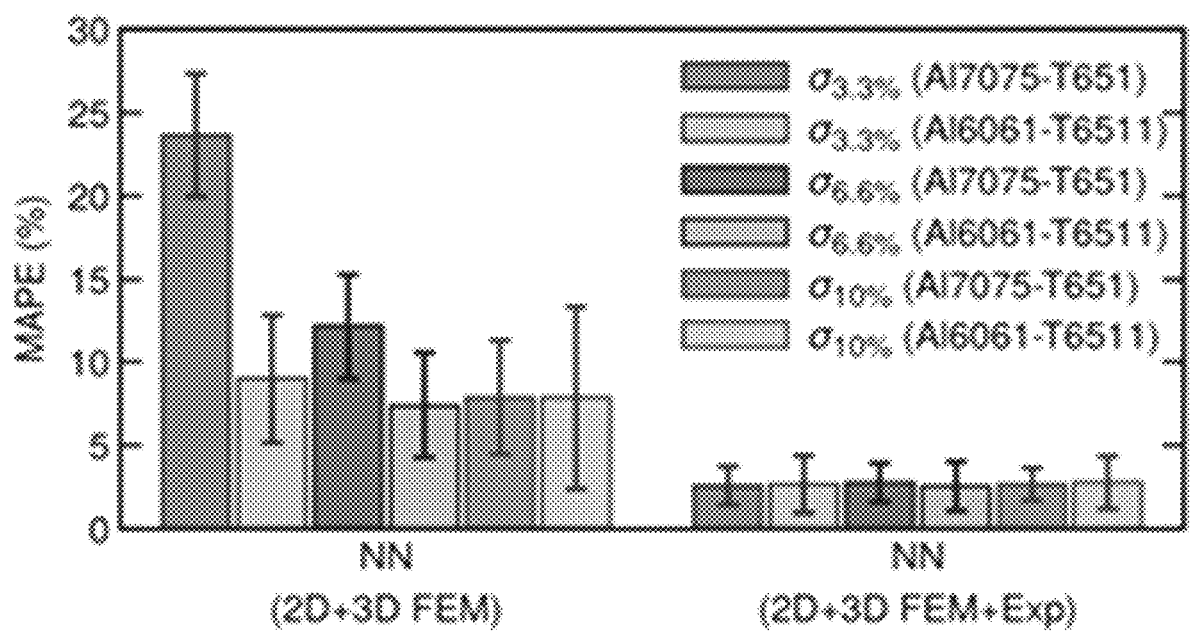

FIG. 11B shows inverse analysis results of using multi-fidelity NNs to extract additional data points from the stress-strain curve (e.g., to determine strain-hardening behavior), where selected stress values at 3.3%, 6.6% and 10% plastic strains are obtained. The NNs trained by adding experimental results as part of the high-fidelity training data also perform very well for $\sigma_{3.3\%}$, $\sigma_{6.6\%}$ and $\sigma_{10\%}$ (where the subscripts 3.3%, 6.6% and 10% represent plastic strains on the stress-strain curve) with MAPE less than 4% for both Al6061-T6511 and Al7075-T651, significantly improving the accuracy for evaluating stresses at different plastic strain using the "hybrid" multi-fidelity approach.

Figure 12A:
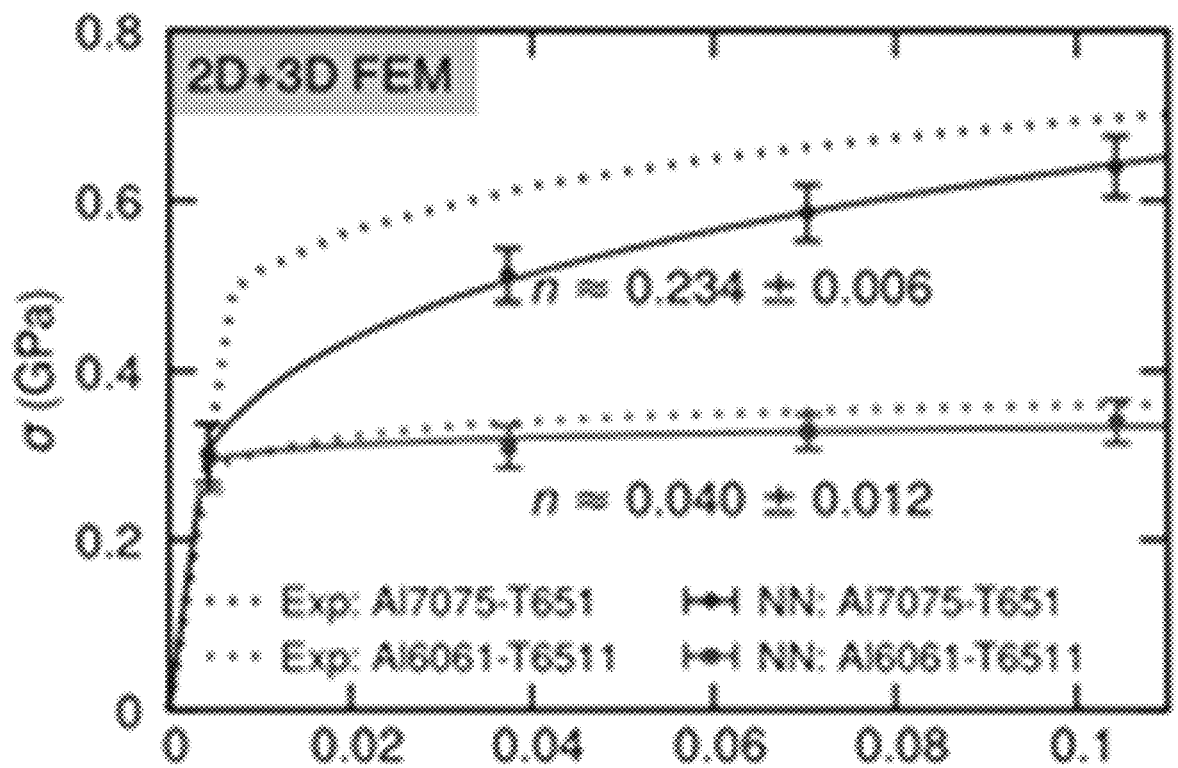
FIGS. 12A and 12B illustrate inverse analysis results of predicting any selected data points on the stress-strain curve and hardening exponent for two different aluminum alloys in accordance with some embodiments.
Figure 12B:
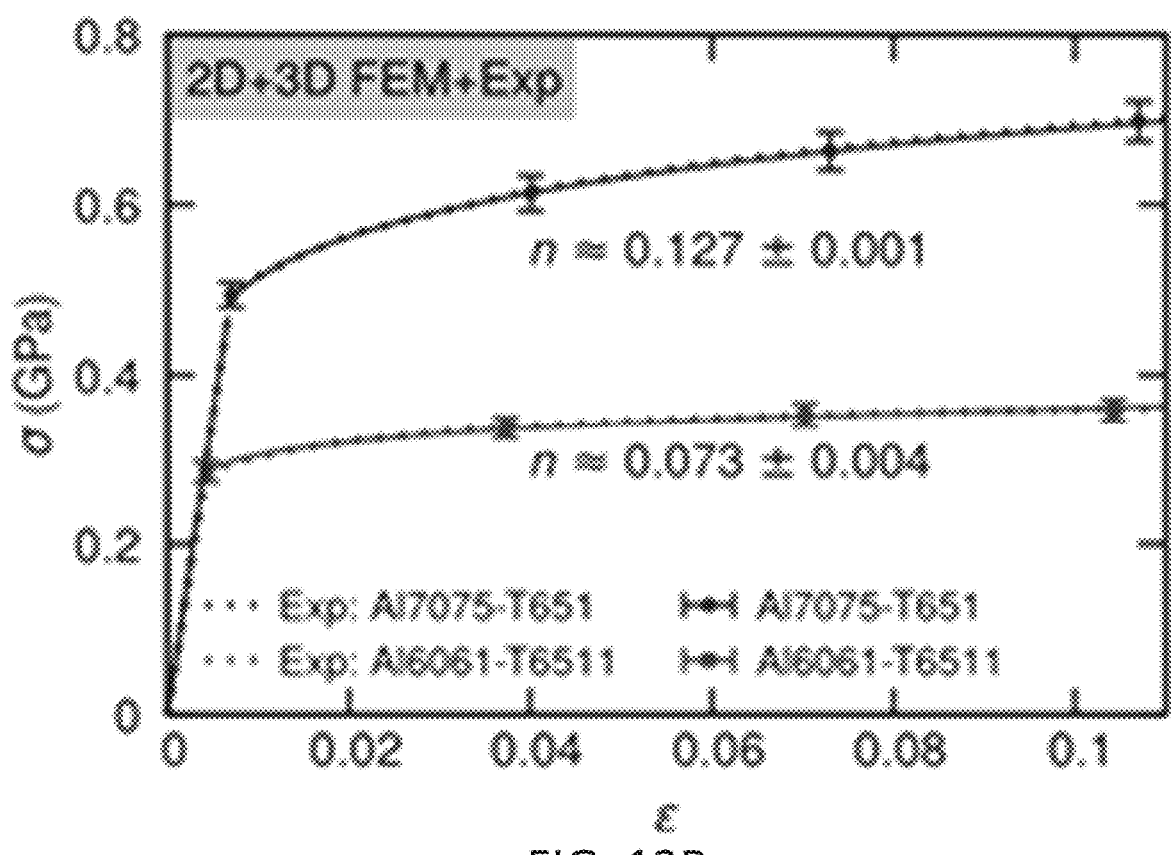

FIGS. 12A and 12B shows the corresponding stress-strain curves obtained by least-squares fitting of the power-law hardening behavior for two aluminum alloys. The hardening exponent was obtained by least-squares fitting of $\sigma_y$, $\sigma_{3.3\%}$, $\sigma_{6.6\%}$ and $\sigma_{10\%}$ predicted by NNs trained using 2D and 3D FEM data (FIG. 12A) and 2D, 3D FEM data and 3 experimental data points (FIG. 12B). The subscripts 3.3%, 6.6% and 10% for $\sigma$ represent plastic strains. Although power law behavior is assumed for this example, any suitable physical law may alternatively be used to characterize the strain behavior for a particular material for which strain behavior is being predicted.

As shown in FIG. 12B, there was good matching of the dashed lines representing experimental data (with experimentally extracted hardening exponent n=0.08 and 0.122) and the solid lines for the hardening exponent n=0.073 and 0.127 for Al6061-T6511 and Al7075-T651, respectively, predicted using the "hybrid" multi-fidelity approach. Note that when hardening is low (i.e. n→0), directly estimated errors of n can be misleading because very small variations in hardening response can lead to large fractional errors for elastic-perfectly plastic metal alloys. Comparing errors in stresses at different plastic stains is a more objective way in evaluating the accuracy with respect to the stress-strain behavior or the hardening behavior.

Figure 13A:
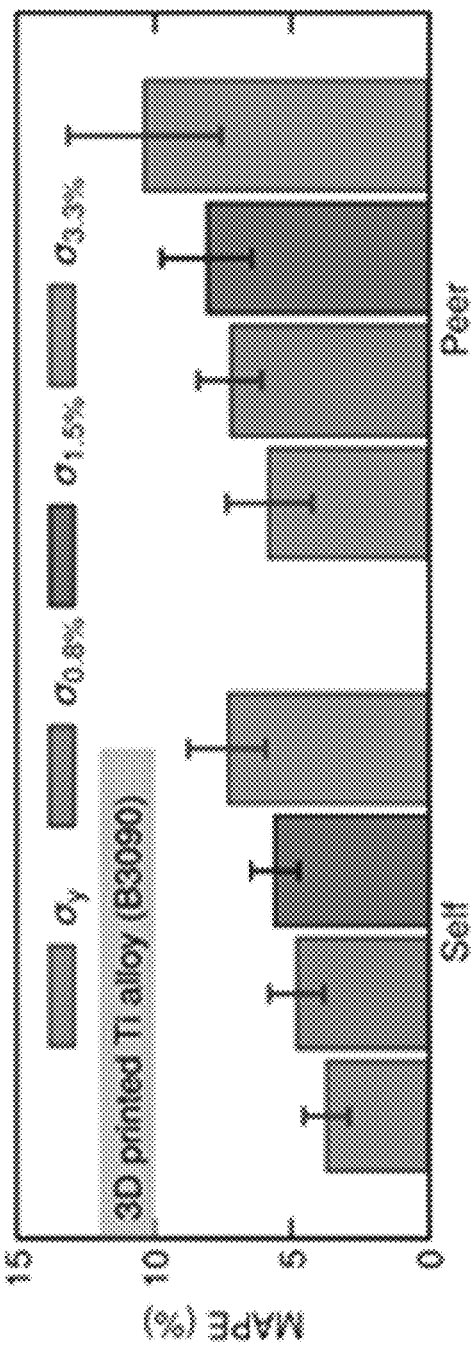
FIGS. 13A, 13B and 13C illustrate inverse analysis results of predicting hardening exponent for two 3D printed alloys in accordance with some embodiments.
Figure 13C:
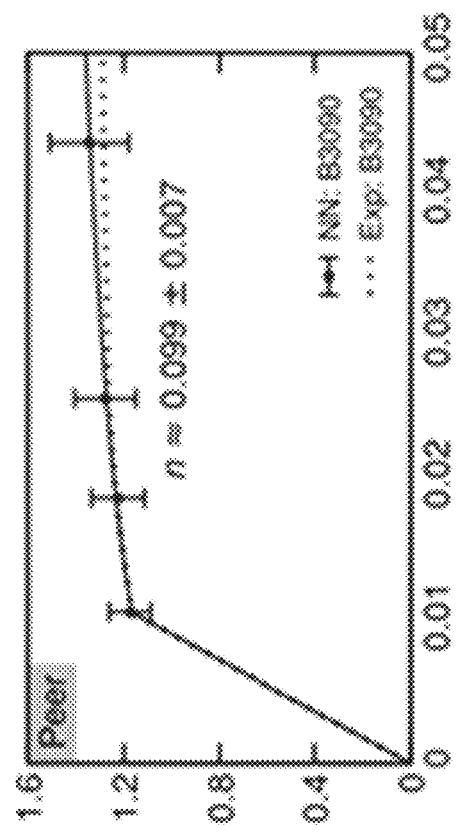
Figure 13B:
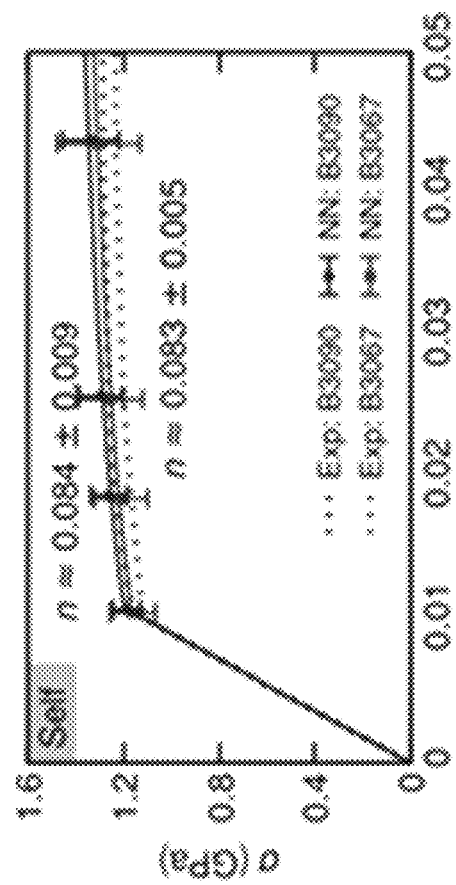

Assuming, for example, power-law strain-hardening behavior, the techniques described herein can be used to evaluate stresses at different plastic strain values, and then compute the strain-hardening exponent by least-squares fitting of the power-law hardening function for 3D-printed titanium alloys. FIGS. 13A-C show inverse analysis results of selected stresses at 0% (i.e., $\sigma_y$), 0.8%, 1.5 and 3.3% plastic strains and the fitted stress-strain curves for two 3D-printed Ti-6Al-4V alloys using the "hybrid" multi-fidelity approach.

FIG. 13A shows the mean average percentage error of $\sigma_y$, $\sigma_{0.8\%}$, $\sigma_{1.5\%}$ and $\sigma_{3.3\%}$ for the 3D printed material B3090 predicted by NNs trained by 2D axisymmetric FEM data (low fidelity) with 3D Berkovich FEM data and five randomly picked "self" and "peer" experimental indentation curves (high fidelity). FIGS. 13B and 13C show that the hardening exponent is obtained by least squares fitting of $\sigma_y$, $\sigma_{0.8\%}$, $\sigma_{1.5\%}$ and $\sigma_{3.3\%}$ for "self" experimental indentation curve (FIG. 13B) and "peer" experimental indentation curve (FIG. 13C). The experimentally extracted best fit hardening exponent was n=0.068 for both B3090 and B3067 uniaxial experiments, i.e. near zero low hardening. With additional experimental data added for training, the NNs predict accurately the yield strength and low hardening behaviors. The subscripts 0.8%, 1.5% and 3.3% for a represent plastic strains. Analogous to evaluating the yield strength $\sigma_y$ (stress at zero plastic strain), the predicted stress-strain curves using the NN techniques described herein are close to the experimental curves when a few experimental data points are added as part of the high-fidelity data for the training of NNs.

The inventors have recognized and appreciated that training a neural network from scratch (e.g., with randomly-assigned variables for the weights) to predict material properties in accordance with the techniques described herein takes a substantial amount of the training data and processing resources. The inventors have also recognized that baseline training can be performed to establish a trained neural network that can be used to represent the material parameter space for the majority of engineering metals under an idealized testing condition. When given the additional experimental data for materials under a specific experimental setup, the baseline neural network can be further trained. Accordingly, some embodiments employ a transfer learning approach in which one or more previously-trained NNs (e.g., a baseline NN) are further trained using new experimental data to tune the weights of the NN(s) to provide accurate prediction of material properties for particular materials. In particular, in the examples discussed above, the "hybrid" training of neural networks for each aluminum alloy and each 3D-printed titanium alloy was conducted with a fresh start without any direct connections to the other trained neural networks. In some embodiments, a transfer learning technique is used, in which the entire multi-fidelity network (both low- and high-fidelity sub-networks) is first trained using all the 2D and 3D FEM data as baseline training. Next given the additional new experimental data, only the high-fidelity sub-network is further trained using these additional experimental data points.

Figure 14A:
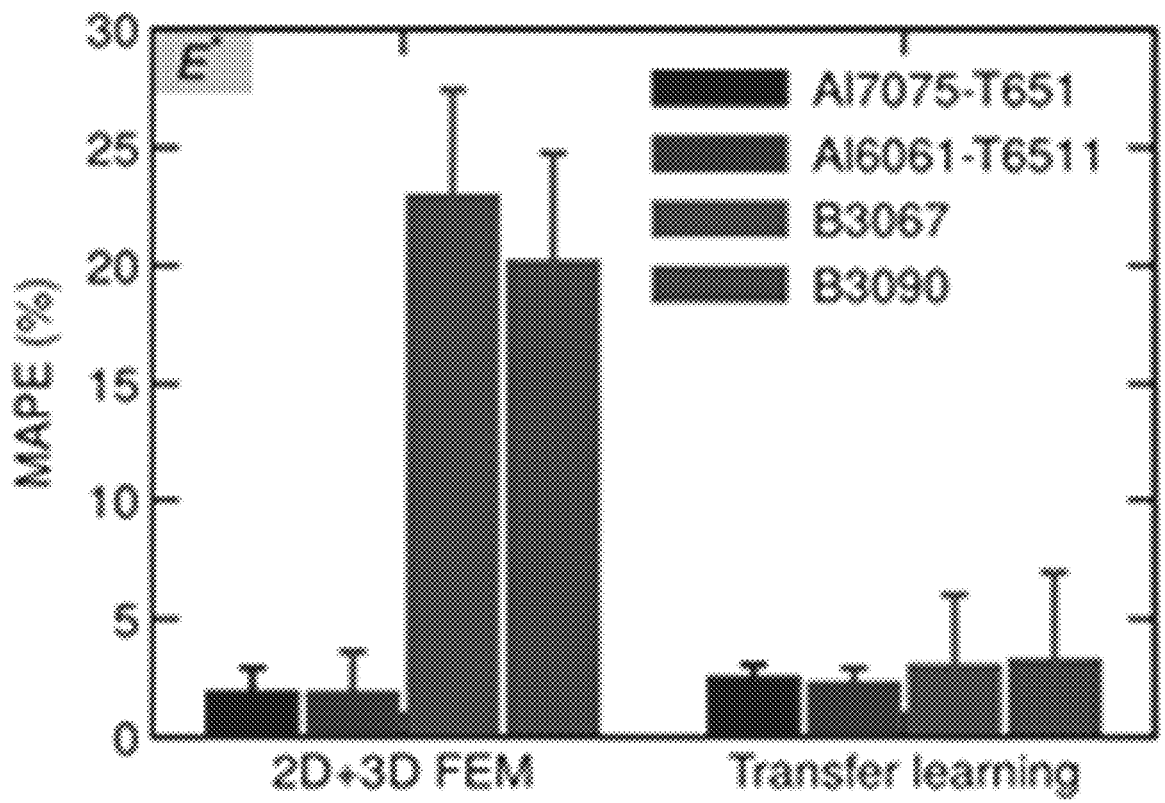
FIGS. 14A and 14B illustrate inverse analysis results for predicting material properties of two aluminum allows via transfer learning in accordance with some embodiments.
Figure 14B:
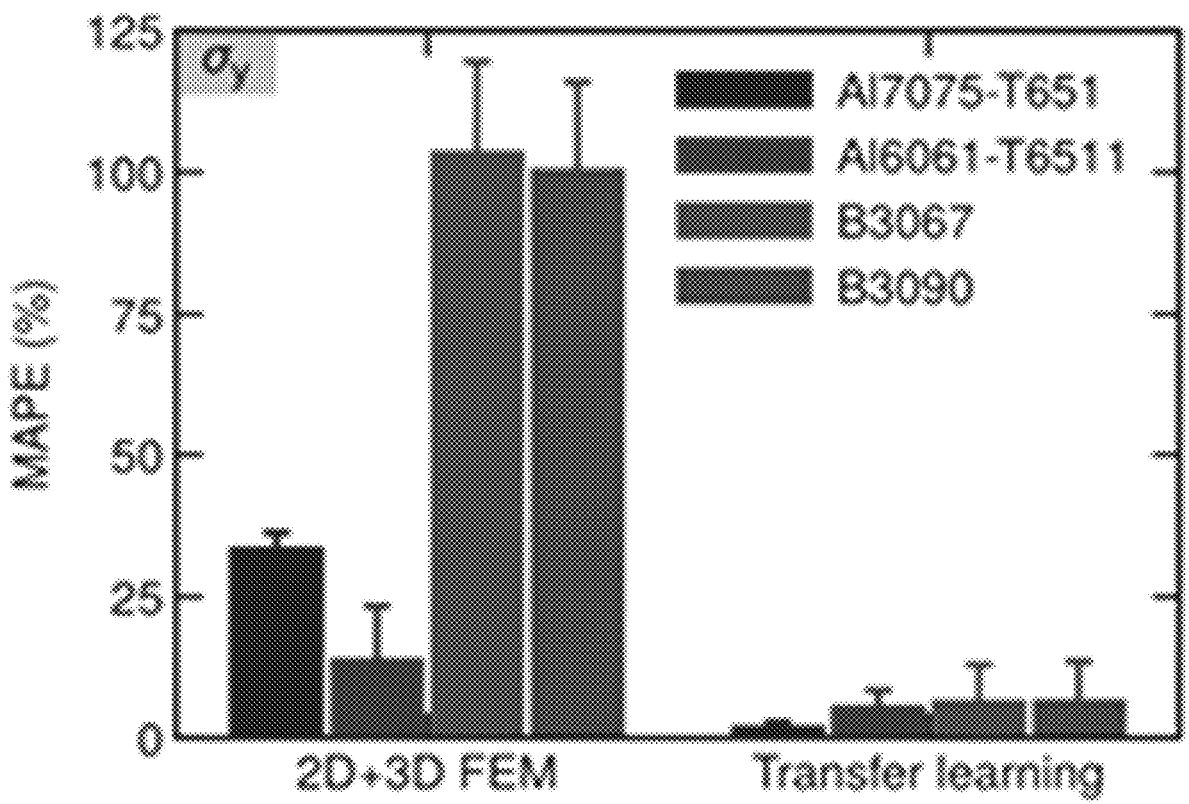

FIGS. 14A and 14B show the errors from the NNs for two aluminum alloys and two 3D printed titanium alloys before (labeled as "2D+3D FEM") and after transfer learning (labeled as "Transfer learning") in accordance with some embodiments. FIG. 14A shows the errors for predicting E*, and FIG. 14B shows the errors for predicting yield strain $\sigma_y$. As shown, a comprehensive baseline training can be established by training the low-fidelity and high-fidelity portions of the NN, and then additional case-specific training can be subsequently used to improve training efficiency and take advantage of accumulated learning rather than having to train the NN from scratch for each new material. With a small number of high-fidelity experimental data points added for training, significant improvements are achieved.

Figure 15:
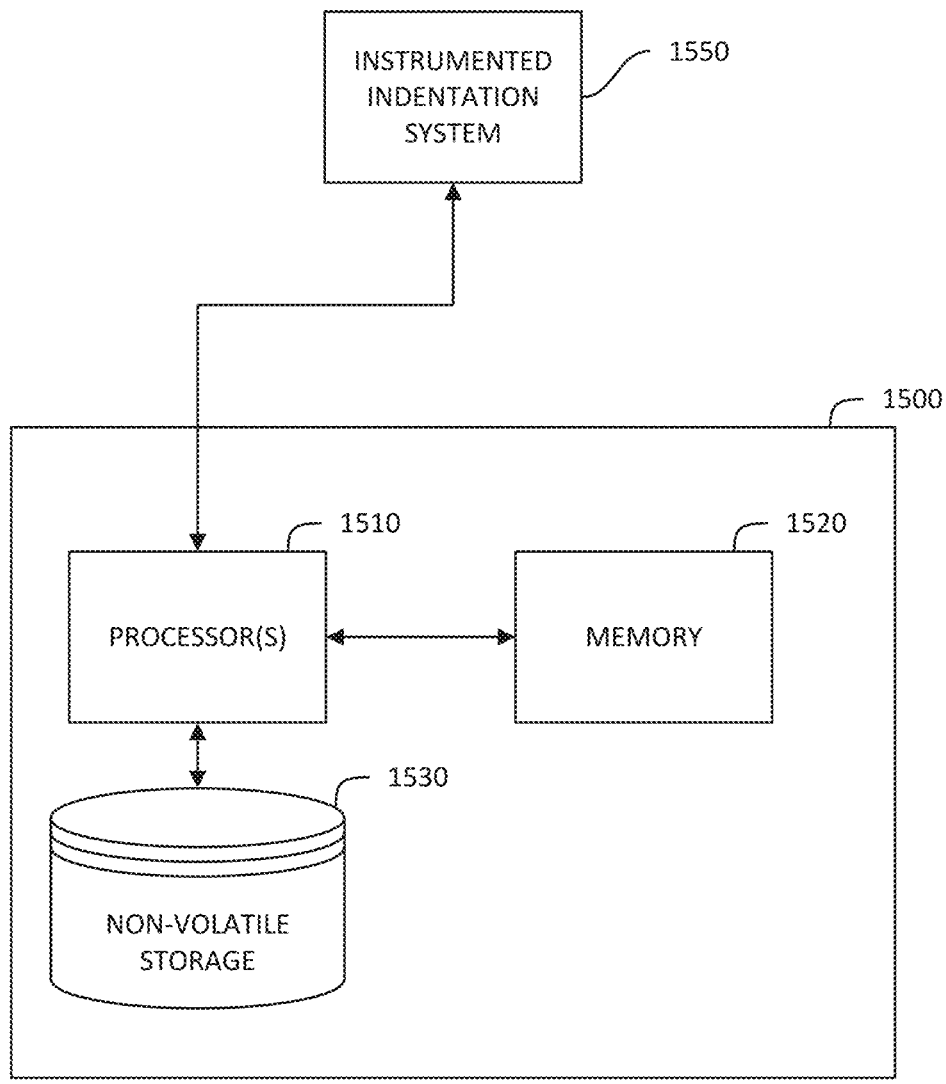
FIG. 15 illustrates an example of a computer system on which some embodiments may be implemented.

An illustrative implementation of a computer system 1500 that may be used in connection with any of the embodiments of the disclosure provided herein is shown in FIG. 15. The computer system 1500 may include one or more computer hardware processors 1500 and one or more articles of manufacture that comprise non-transitory computer-readable storage media (e.g., memory 1520 and one or more non-volatile storage devices 1530). The processor 1510(s) may control writing data to and reading data from the memory 1520 and the non-volatile storage device(s) 1530 in any suitable manner. To perform any of the functionality described herein, the processor(s) 1510 may execute one or more processor-executable instructions stored in one or more non-transitory computer-readable storage media (e.g., the memory 1520), which may serve as non-transitory computer-readable storage media storing processor-executable instructions for execution by the processor(s) 1510. As shown, computer system 1500 may include and/or be in communication with instrumented indentation system 1550 configured to perform one or more instrumented indentation tests on a material to determined indentation data. In some embodiments, the instrumented indentation system 1550 includes a robotic arm. The indentation data may be used to determine indentation parameters used to train a neural network model using one or more of the techniques described herein. At least some of the indentation parameters may be provided to a trained neural network to determine or more mechanical properties of a material using one or more of the techniques described herein.

The various methods or processes outlined herein may be implemented in any suitable hardware. Additionally, the various methods or processes outlined herein may be implemented in a combination of hardware and of software executable on one or more processors that employ any one of a variety of operating systems or platforms. Any suitable combination of hardware and software may be employed to realize any of the embodiments discussed herein.

In this respect, various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, implement the various embodiments of the present invention. The non-transitory computer-readable medium or media may be transportable, such that the program or programs stored thereon may be loaded onto any computer resource to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion among different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Having herein described several embodiments, several advantages of embodiments of the present application should be apparent. One advantage is that an object may be designed based on any number of available materials such that the object, when fabricated, exhibits one or more desired properties. A non-limiting list of applications for which embodiments described herein may be used include optics, mechanical engineering, industrial design, aerospace design, musical instruments, toys and games, and combinations thereof.

Furthermore, the techniques described herein may, in some embodiments, provide in an approach to designing an object that is modular, extensible, independent of object geometry and/or independent of a fabrication device which may be used to subsequently fabricate the object. In some embodiments, a design of an object may be determined independently of a type of fabrication device that may be subsequently used to fabricate the designed object. For example, while one or more material properties may be provided as input to the design process, these materials may not uniquely correspond to a particular fabrication device or fabrication process.

Various inventive concepts may be embodied as one or more methods, of which examples have been provided. The acts performed as part of any method described herein may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein, unless clearly indicated to the contrary, should be understood to mean "at least one."

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting.

The invention claimed is:

1. A computer system configured to train a neural network to extract one or more mechanical properties of a material from indentation parameters for the material, the computer system comprising:
   at least one computer processor; and
   at least one non-transitory computer readable medium encoded with instructions that, when executed by the at least one computer processor, perform a method, comprising:
      providing as input to the neural network, the indentation parameters for the material;
      training the neural network to map the input indentation parameters to the one or more mechanical properties of the material; and
      storing the trained neural network on the at least one non-transitory computer readable medium,
   wherein the neural network includes a first portion configured to receive as input low-fidelity indentation parameters, a second portion configured to receive as input high-fidelity indentation parameters, and an integration portion that integrates one or more outputs of the first portion and one or more outputs of the second portion.

2. The computer system of claim 1, wherein training the neural network comprises training the first portion of the neural network based on the low-fidelity indentation parameters and training the second portion of the neural network based on the high-fidelity indentation parameters.

3. The computer system of claim 2, wherein training the neural network further comprises integrating both the high-fidelity indentation parameters and the low-fidelity implementation parameters using convolution and/or recursion.

4. The computer system of claim 2, wherein a number of datum in the high-fidelity indentation parameters used to train the first portion of the neural network is less than a number of datum in the low-fidelity indentation parameters used to train the second portion of the neural network.

5. The computer system of claim 1, wherein the high-fidelity indentation parameters include first indentation parameters determined from one or more simulations and second indentation parameters determined from one or more indentation tests on the material.

6. The computer system of claim 1, wherein training the neural network comprises training the neural network to reduce at least one systematic error by using data determined from one or more indentation tests on the material to determine at least some of the high-fidelity indentation parameters.

7. The computer system of claim 1, wherein the low-fidelity indentation parameters include indentation parameters determined using one or more simulations.

8. The computer system of claim 1, wherein
   the first portion and/or the second portion of the neural network are pre-trained using a baseline training process; and
   training the neural network to map the input indentation parameters to the one or more mechanical properties of the material comprises training only the second portion of the neural network with high-fidelity indentation parameters.

9. The computer system of claim 1, wherein the neural network includes convolutional and recursive linear and/or nonlinear integration of training data with at least three levels of fidelities.

10. The computer system of claim 1, wherein the indentation parameters include indentation parameters for multiple indenter geometries.

11. The computer system of claim 10, wherein the multiple indenter geometries have different half-included tip angles.

12. The computer system of claim 10, wherein the multiple indenter geometries include multiple indenter shapes.

13. The computer system of claim 1, wherein the one or more mechanical properties include a reduced Young's modulus, a yield strength, and/or a strain hardening parameter.

14. The computer system of claim 13, wherein the one or more mechanical properties include at least two of a reduced Young's modulus, a yield strength, and a strain hardening parameters.

15. The computer system of claim 1, wherein the one or more mechanical properties include a plurality of points on a stress-strain curve.

16. The computer system of claim 15, wherein the one or more mechanical properties include a plurality of strain values at different plastic strains.

17. The computer system of claim 1, wherein the one or more indentation parameters include one or more indentation parameters extracted from a loading portion of an indentation curve, an unloading portion of the indentation curve, and/or both the loading and the unloading portion of the indentation curve.

18. The computer system of claim 1, wherein the one or more indentation parameters include one or more of loading curvature, initial unloading slope, and plastic work ratio.

19. The computer system of claim 18, wherein the one or more indentation parameters include the loading curvature, the initial unloading slope and the plastic work ratio.

20. The computer system of claim 1, wherein the method further comprises:
receiving load-displacement data for the material; and
determining the one or more indentation parameters from the received load-displacement data.

21. The computer system of claim 1, wherein the material comprises a 3D printed material.

22. The computer system of claim 1, wherein training the neural network comprises training the neural network using training data having more than two levels of fidelities.

23. A method of training a neural network to extract one or more mechanical properties of a material from indentation parameters for the material, the method comprising:
providing as input to the neural network, the indentation parameters for the material;
training, using at least one computer processor, the neural network to map the input indentation parameters to the one or more mechanical properties of the material; and
storing the trained neural network on at least one non-transitory computer readable medium,
wherein the neural network includes a first portion configured to receive as input low-fidelity indentation parameters, a second portion configured to receive as input high-fidelity indentation parameters, and an integration portion that integrates one or more outputs of the first portion and one or more outputs of the second portion.

24. The method of claim 23, wherein training the neural network comprises training the first portion of the neural network based on the low-fidelity indentation parameters and training the second portion of the neural network based on the high-fidelity indentation parameters.

25. The method of claim 24, wherein training the neural network further comprises integrating both the high-fidelity indentation parameters and the low-fidelity implementation parameters using convolution and/or recursion.

26. The method of claim 24, wherein a number of datum in the high-fidelity indentation parameters used to train the first portion of the neural network is less than a number of datum in the low-fidelity indentation parameters used to train the second portion of the neural network.

27. The method of claim 23, wherein the high-fidelity indentation parameters include first indentation parameters determined from one or more simulations and second indentation parameters determined from one or more indentation tests on the material.

28. The method of claim 23, wherein training the neural network comprises training the neural network to reduce at least one systematic error by using data determined from one or more indentation tests on the material to determine at least some of the high-fidelity indentation parameters.

29. The method of claim 23, wherein the low-fidelity indentation parameters include indentation parameters determined using one or more simulations.

30. The method of claim 23, wherein
the first portion and/or the second portion of the neural network are pre-trained using a baseline training process, and
training the neural network to map the input indentation parameters to the one or more mechanical properties of the material comprises training only the second portion of the neural network with high-fidelity indentation parameters.

31. The method of claim 23, wherein the neural network includes convolutional and recursive linear and/or nonlinear integration of training data with at least three levels of fidelities.

32. The method of claim 23, wherein the indentation parameters include indentation parameters for multiple indenter geometries.

33. The method of claim 32, wherein the multiple indenter geometries have different half-included tip angles.

34. The method of claim 32, wherein the multiple indenter geometries include multiple indenter shapes.

35. The method of claim 23, wherein the one or more mechanical properties include a reduced Young's modulus, a yield strength, and/or a strain hardening parameter.

36. The method of claim 35, wherein the one or more mechanical properties include at least two of a reduced Young's modulus, a yield strength, and a strain hardening parameters.

37. The method of claim 23, wherein the one or more mechanical properties include a plurality of points on a stress-strain curve.

38. The method of claim 37, wherein the one or more mechanical properties include a plurality of strain values at different plastic strains.

39. The method of claim 23, further comprising:
extracting the one or more indentation parameters from a loading portion of an indentation curve, an unloading portion of the indentation curve, and/or both the loading and the unloading portion of the indentation curve.

40. The method of claim 23, wherein the one or more indentation parameters include one or more of loading curvature, initial unloading slope, and plastic work ratio.

41. The method of claim 40, wherein the one or more indentation parameters include the loading curvature, the initial unloading slope and the plastic work ratio.

42. The method of claim 23, further comprising:
receiving load-displacement data for the material; and
determining the one or more indentation parameters from the received load-displacement data.

43. The method of claim 23, wherein the material comprises a 3D printed material.

44. The method of claim 23, wherein training the neural network comprises training the neural network using training data having more than two levels of fidelities.

* * * * *

UNITED STATES PATENT AND TRADEMARK OFFICE
CERTIFICATE OF CORRECTION

| | | |
|---|---|---|
| PATENT NO. | : 11,461,519 B2 | Page 1 of 1 |
| APPLICATION NO. | : 17/620219 | |
| DATED | : October 4, 2022 | |
| INVENTOR(S) | : Lu Lu et al. | |

It is certified that error appears in the above-identified patent and that said Letters Patent is hereby corrected as shown below:

In the Specification

Column 1, at Line 21, please insert the following paragraph after the CROSS-REFERENCE TO RELATED APPLICATIONS paragraph:
--STATEMENT REGARDING FEDERALLY SPONSORED RESEARCH
This invention was made with government support under grant number W911NF-12-2-0023 awarded by the U.S. Army Research Office and grant number DE-SC0019453 awarded by the Department of Energy. The government has certain rights in the invention.--

Signed and Sealed this
Sixteenth Day of July, 2024

Katherine Kelly Vidal
*Director of the United States Patent and Trademark Office*